US010395961B2

(12) United States Patent
Miyamoto

(10) Patent No.: US 10,395,961 B2
(45) Date of Patent: Aug. 27, 2019

(54) POSTURE CHANGING DEVICE

(71) Applicant: SCREEN Holdings Co., Ltd., Kyoto (JP)

(72) Inventor: Yukiteru Miyamoto, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 36 days.

(21) Appl. No.: 15/695,142

(22) Filed: Sep. 5, 2017

(65) Prior Publication Data

US 2018/0090358 A1    Mar. 29, 2018

(30) Foreign Application Priority Data

Sep. 29, 2016  (JP) ................................ 2016-190863

(51) Int. Cl.
| | | |
|---|---|---|
| H01L 21/677 | (2006.01) | |
| H01L 21/67 | (2006.01) | |
| H01L 21/68 | (2006.01) | |
| H01L 21/687 | (2006.01) | |
| H01L 21/673 | (2006.01) | |

(52) U.S. Cl.
CPC .. *H01L 21/67781* (2013.01); *H01L 21/67265* (2013.01); *H01L 21/67288* (2013.01); *H01L 21/67718* (2013.01); *H01L 21/67766* (2013.01); *H01L 21/68* (2013.01); *H01L 21/6875* (2013.01); *H01L 21/6732* (2013.01); *H01L 21/67326* (2013.01)

(58) Field of Classification Search
CPC ......... H01L 21/67796; H01L 21/67288; H01L 21/67313; H01L 21/67781; H01L 21/67383; H01L 21/67766; B65G 49/061; B65G 49/063; B65G 49/067; Y10S 414/137

USPC ....................... 414/217, 416.08, 416.11, 938
See application file for complete search history.

(56) References Cited

U.S. PATENT DOCUMENTS

| | | | | |
|---|---|---|---|---|
| 4,611,966 A | * | 9/1986 | Johnson .................. | H01L 21/67 414/404 |
| 4,957,406 A | * | 9/1990 | Akagawa ................ | B65G 47/26 294/87.1 |
| 5,125,784 A | * | 6/1992 | Asano ................ | H01L 21/67781 414/404 |
| 6,321,898 B1 | * | 11/2001 | Inoue ................ | H01L 21/67781 198/346.1 |

(Continued)

FOREIGN PATENT DOCUMENTS

| | | |
|---|---|---|
| JP | 2010-93230 A | 4/2010 |
| JP | 4795893 B | 8/2011 |
| KR | 10-2006-0118394 | 11/2006 |

*Primary Examiner* — Gregory W Adams
(74) *Attorney, Agent, or Firm* — Ostrolenk Faber LLP

(57) ABSTRACT

A posture changing device changes the posture of a substrate from one of horizontal and vertical postures to the other posture. In the posture changing device, before transfer of the substrate between a vertical holder and a pusher, a controller controls a holder shifting mechanism on the basis of a warped state of the substrate to shift the position in the thickness direction of a horizontal holder by a shift distance from the vertical holder, the shift distance being determined on the basis of the warped state. Thus, it is possible to suitably transfer the substrate between the vertical holder and the pusher, even if the substrate is warped, while preventing the substrate from coming into contact with the horizontal holder.

8 Claims, 29 Drawing Sheets

(56) References Cited

U.S. PATENT DOCUMENTS

| | | | |
|---|---|---|---|
| 6,769,855 B2 * | 8/2004 | Yokomori | H01L 21/67781 414/416.02 |
| 8,851,821 B2 * | 10/2014 | Mitsuyoshi | B65G 49/061 414/416.08 |
| 2002/0146309 A1 * | 10/2002 | Di Cesare | H01L 21/67778 414/416.08 |
| 2006/0137726 A1 | 6/2006 | Sano et al. | 134/61 |
| 2006/0216137 A1 | 9/2006 | Sakata et al. | 414/222.13 |
| 2010/0068014 A1 | 3/2010 | Mitsuyoshi et al. | 414/225.01 |
| 2012/0099951 A1 | 4/2012 | Kajiwara et al. | 414/222.07 |
| 2012/0249992 A1 | 10/2012 | Matsuura et al. | 355/72 |
| 2012/0315113 A1 | 12/2012 | Hiroki | 414/217 |

\* cited by examiner

POSTURE CHANGING DEVICE

TECHNICAL FIELD

The present invention relates to a technique for changing the posture of substrates from one of horizontal and vertical postures to the other posture.

BACKGROUND ART

Substrate processing apparatuses that perform various types of processing on substrates have conventionally been used in the process of manufacturing semiconductor substrates (hereinafter, simply referred to as "substrates"). For example, Japanese Patent Application Laid-Open No. 2010-93230 (Document 1) discloses a batch-type substrate processing apparatus that processes a plurality of substrates by one operation. With the substrate processing apparatus in Document 1, a plurality of substrates held in a horizontal posture and aligned along the thickness (hereinafter, referred to as a "thickness direction") of the substrates are transported into the apparatus, and a posture changing mechanism changes the posture of the plurality of substrates to a vertical posture at once and then collectively transfers the substrates to a pusher.

The posture changing mechanism includes a horizontal holding member that holds a plurality of substrates in a horizontal posture, and a holding groove member that holds a plurality of substrates in a vertical posture. The horizontal holding member and the holding groove member are disposed adjacent to each other and are rotatable at once. In the posture changing mechanism, when a plurality of substrates are in a horizontal posture, the horizontal holding member supports each substrate in a horizontal posture from the underside while being in contact with the lower surface of the substrate. Then, the posture of the plurality of substrates is changed to a vertical posture by rotating the horizontal holding member and the holding groove member by 90 degrees along with the substrates, so that each substrate is supported from the underside by the holding groove member, which is positioned adjacent to and below the horizontal holding member. Thereafter, an up-and-down holder of the pusher collectively receives and holds the substrates in a vertical posture from the holding groove member while moving from below to above the holding groove member and the horizontal holding member. At this time, the substrates held in a vertical posture by the up-and-down holder move upward along the horizontal holding member.

In some cases, substrates to be processed by the substrate processing apparatus may be warped under the influence of processing performed before transport to the substrate processing apparatus. The sizes in the thickness direction of warped substrates are larger than those of flat substrates, which are not warped. Thus, when the plurality of substrates are transferred from the posture changing mechanism to the pusher in Document 1, the substrates that are held in a vertical posture and moved upward by the up-and-down holder may come into contact with the horizontal holding member.

SUMMARY OF INVENTION

The present invention is intended for a posture changing device, and it is an object of the present invention to suitably transfer substrates, even if the substrates are warped, while preventing the substrates from coming into contact with a horizontal holder.

A posture changing device according to the present invention changes the posture of a substrate from one of horizontal and vertical postures to the other posture. The posture changing device includes a vertical holder for, when a substrate is in a vertical posture, catching and holding a lower edge portion of the substrate on two sides in a circumferential direction of a bottom edge portion of the substrate, with the bottom edge portion projecting downward from the vertical holder, a horizontal holder for, when the substrate is in a horizontal posture, supporting a lower surface of the substrate from underside on two sides in a radial direction of the substrate, the horizontal holder being disposed above and adjacent to the vertical holder in a state in which the vertical holder holds the substrate in a vertical posture, a mounting block on which the vertical holder and the horizontal holder are mounted, a holder rotation mechanism for rotating the mounting block about a rotational shaft pointing in a horizontal direction to switch between a vertical holding state and a horizontal holding state, the vertical holding state being a state in which the vertical holder is capable of holding the substrate in a vertical posture, and the horizontal holding state being a state in which the horizontal holder is capable of holding the substrate in a horizontal posture, a holder shifting mechanism for shifting the horizontal holder relative to the vertical holder in a thickness direction of the substrate, a pusher for transferring the substrate held in a vertical posture to and from the vertical holder, and a controller for, before transfer of the substrate between the vertical holder and the pusher, controlling the holder shifting mechanism on the basis of a warped state of the substrate to shift a position in the thickness direction of the horizontal holder by a shift distance from the vertical holder, the shift distance being determined on the basis of the warped state. With this posture changing device, it is possible to suitably transfer a substrate, even if the substrate is warped, while preventing the substrate from coming into contact with the horizontal holder.

In a preferred embodiment of the present invention, the holder shifting mechanism relatively shifts the horizontal holder before the pusher receives the substrate from the vertical holder.

More preferably, the holder shifting mechanism relatively shifts the horizontal holder in the vertical holding state.

In another preferred embodiment of the present invention, the holder shifting mechanism relatively shifts the horizontal holder before the vertical holder receives the substrate from the pusher.

More preferably, the holder shifting mechanism relatively shifts the horizontal holder in the horizontal holding state.

In another preferred embodiment of the present invention, the posture changing device further includes a substrate alignment mechanism for rotating the substrate in a circumferential direction to change a circumferential orientation of the substrate. When the substrate is curved in one radial direction to one side in the thickness direction with a minimum curvature, the controller controls the substrate alignment mechanism on the basis of the warped state of the substrate, before transfer of the substrate between the vertical holder and the pusher, to make the one radial direction of the substrate that is held in a vertical posture by the vertical holder, parallel to an up-down direction.

In another preferred embodiment of the present invention, the vertical holder holds another substrate in a vertical position along with and in the same manner as the substrate in a vertical posture, the another substrate being aligned with the substrate in the thickness direction. The horizontal holder holds the another substrate in a horizontal posture along with and in the same manner as the substrate in a horizontal posture, the another substrate being aligned with the substrate in the thickness direction. The pusher transfers the another substrate held in a vertical posture to and from the vertical holder, along with the substrate in a vertical posture.

These and other objects, features, aspects and advantages of the present invention will become more apparent from the following detailed description of the present invention when taken in conjunction with the accompanying drawings.

DESCRIPTION OF EMBODIMENTS

Figure 1:
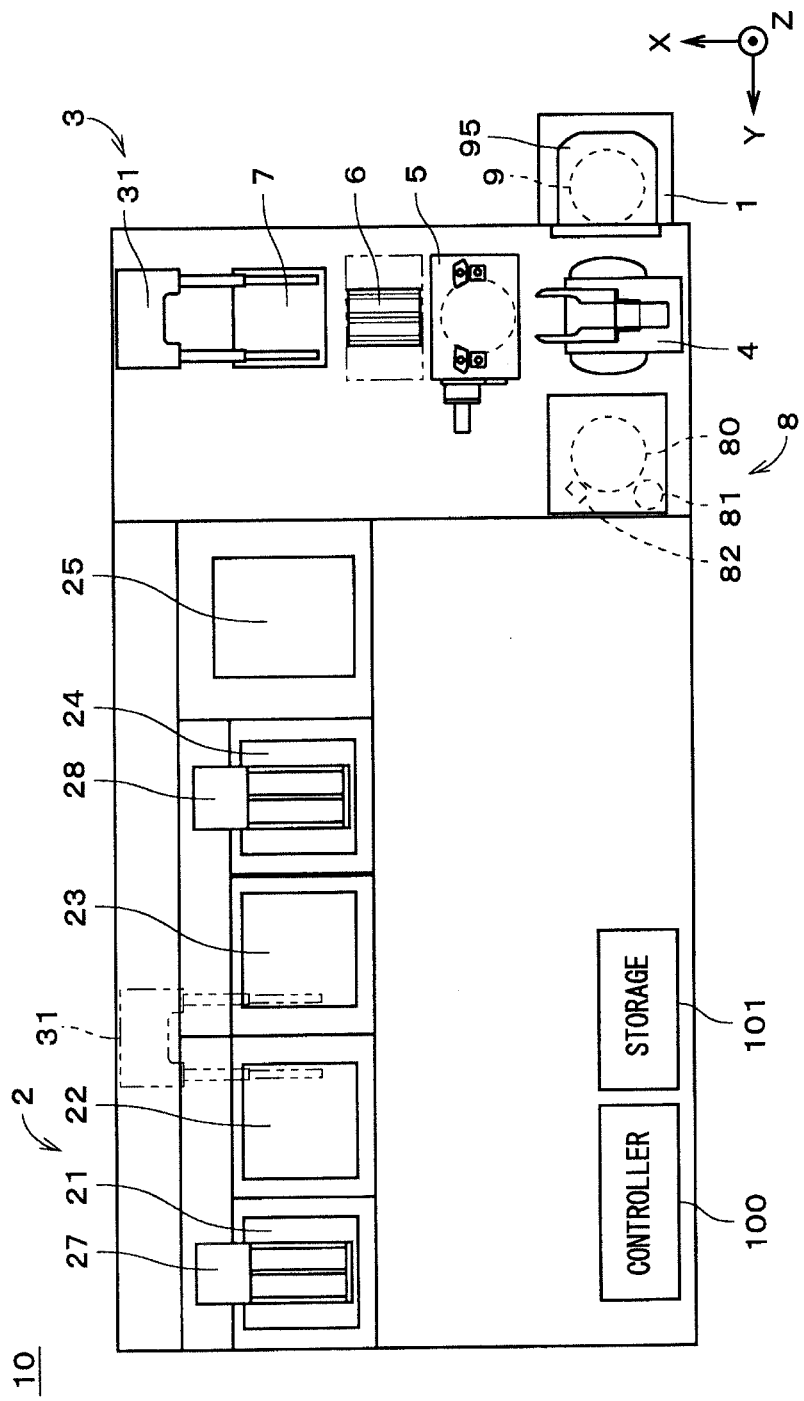
FIG. 1 is a plan view of a substrate processing apparatus according to an embodiment.

FIG. 1 is a plan view of a substrate processing apparatus 10 according to an embodiment of the present invention. The substrate processing apparatus 10 has an approximately rectangular shape in plan view. The substrate processing apparatus 10 is a batch-type substrate processing apparatus that processes a plurality of semiconductor substrates 9 (hereinafter, simply referred to as "substrates 9") by one operation. The substrates 9 are approximately disc-like substrates. Each substrate 9 has a notch 93 (see FIGS. 4 and 5) indicating a crystal orientation in a peripheral portion. The notch 93 has a depth of approximately 1 mm from the outer periphery of the substrate 9.

The substrate processing apparatus 10 includes a FOUP holder 1, a substrate processing part 2, a main transport mechanism 3, a carry-in-and-out mechanism 4, a posture changing mechanism 5, a pusher 6, a delivery mechanism 7, a substrate alignment mechanism 8, a controller 100, and a storage 101. The controller 100 controls operations or other activities of each constituent element of the substrate processing apparatus 10. The controller 100 is a general computer system that includes, for example, a CPU for performing various types of computations, a ROM for storing basic programs, and a RAM for storing various types of information. The FOUP holder 1 is disposed at one corner of the substrate processing apparatus 10. The FOUP holder 1 holds a FOUP 95. The FOUP 95 is a container that houses a plurality of (e.g., 25) substrates 9 in a horizontal posture, with the substrates 9 being stacked in the Z direction.

The Z direction in FIG. 1 is a direction parallel to the direction of gravity, and is also referred to as an "up-down direction." The X direction in FIG. 1 is a direction perpendicular to the Z direction. The Y direction is a direction perpendicular to the X and Y directions. A horizontal posture of the substrates 9 refers to a posture in which the direction of the normal to the main surfaces of the substrates 9 points in approximately the Z direction. A vertical posture of the substrates 9, which will be described later, refers to a posture in which the direction of the normal to the main surfaces of the substrates 9 points in a direction approximately perpendicular to the Z direction. In the substrate processing apparatus 10, a plurality of substrates 9 are stacked in either a horizontal or vertical posture in a direction approximately perpendicular to the main surfaces of the substrates 9. In other words, the plurality of substrates 9 in a horizontal or vertical posture are aligned in the thickness direction of the substrates 9.

Figure 2:
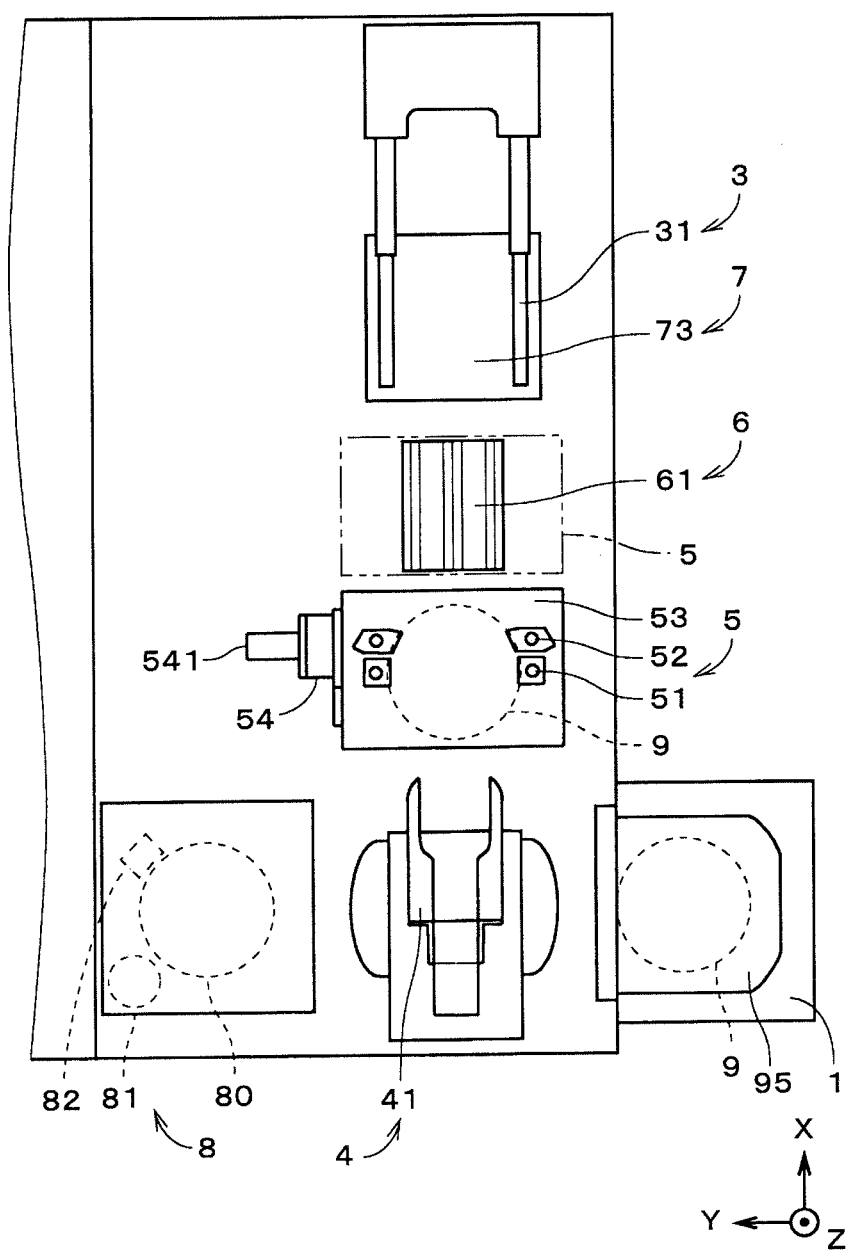
FIG. 2 is a plan view of part of the substrate processing apparatus.
Figure 3:
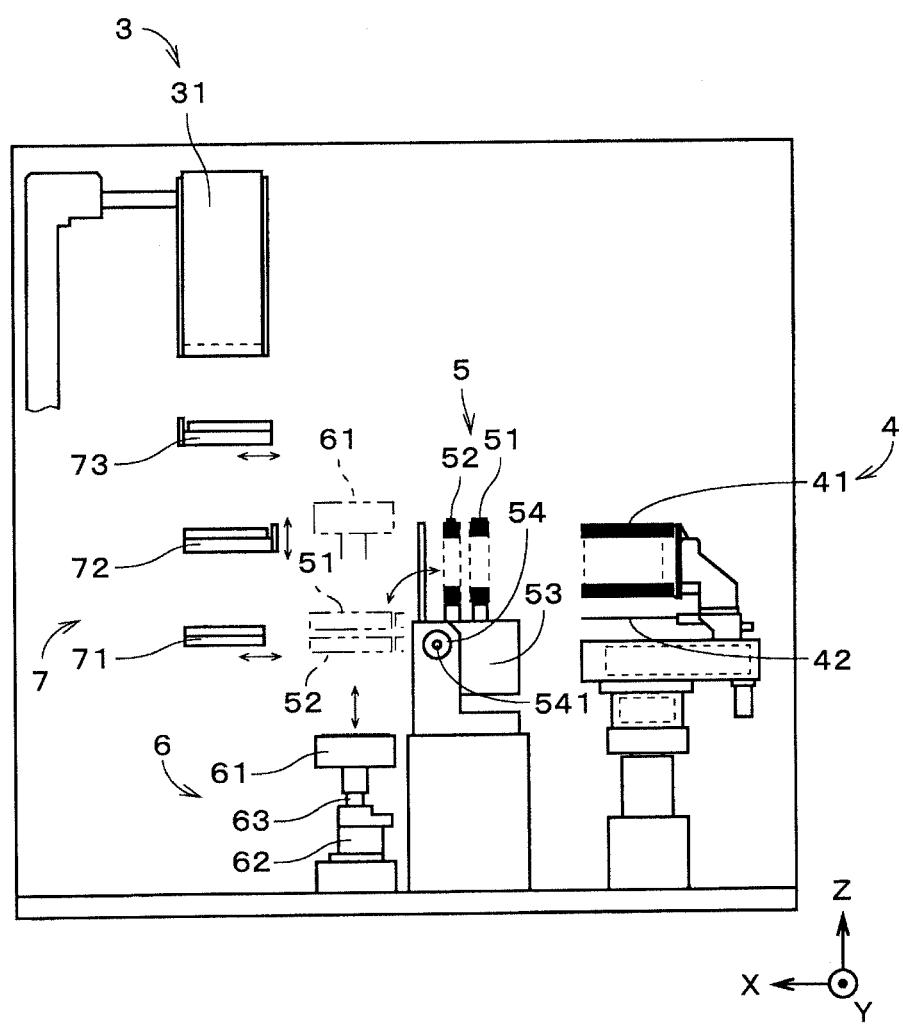
FIG. 3 is a side view of part of the substrate processing apparatus.

FIG. 2 is an enlarged plan view of a portion on the -Y side of the substrate processing apparatus 10. FIG. 3 is a side view of the portion on the -Y side of the substrate processing apparatus 10. In the substrate processing apparatus 10, the carry-in-and-out mechanism 4 is disposed on the +Y side of the FOUP holder 1 and opposes the FOUP holder 1 in the Y direction as illustrated in FIG. 2. The substrate alignment mechanism 8 is disposed on the +Y side of the carry-in-and-out mechanism 4. The FOUP holder 1 and the substrate alignment mechanism 8 are not shown in FIG. 3.

As illustrated in FIGS. 2 and 3, the posture changing mechanism 5 is disposed on the +X side of the carry-in-and-out mechanism 4. The pusher 6 is disposed on the +X side of the posture changing mechanism 5. The delivery mechanism 7 and the main transport mechanism 3 are disposed on the +X side of the pusher 6. In the state illustrated in FIG. 3, the main transport mechanism 3 is located on the +Z side of (i.e., above) the delivery mechanism 7. The substrate processing part 2 is disposed on the +Y side of the main transport mechanism 3 as illustrated in FIG. 1.

The substrate processing part 2 includes a first liquid chemical tank 21, a first rinsing liquid tank 22, a second liquid chemical tank 23, a second rinsing liquid tank 24, a dry processing part 25, a first lifter 27, and a second lifter 28. The first liquid chemical tank 21, the first rinsing liquid tank 22, the second liquid chemical tank 23, the second rinsing liquid tank 24, and the dry processing part 25 are aligned in the Y direction from the +Y side to the -Y side in the specified order. The first liquid chemical tank 21 and the second liquid chemical tank 23 retain liquid chemicals of the same type or different types. The first rinsing liquid tank 22 and the second rinsing liquid tank 24 each retain a rinsing liquid (e.g., deionized water).

When the substrate processing apparatus 10 processes substrates 9, a FOUP 95 that houses a plurality of (e.g., 25) substrates 9 in a horizontal posture is first prepared. Then, one of the plurality of (e.g., 25) substrates housed in the FOUP 95 is held by a single-substrate hand 42 of the carry-in-and-out mechanism 4 illustrated in FIGS. 2 and 3 and transported out of the FOUP 95. The single-substrate hand 42 holds a single substrate 9 in a horizontal posture. The carry-in-and-out mechanism 4 also includes a batch hand 41 that collectively holds a plurality of substrates 9 aligned in the Z direction in a horizontal posture.

Then, the single-substrate hand 42 rotates horizontally and moves ahead toward the substrate alignment mechanism 8 so that the single substrate 9 is transferred from the carry-in-and-out mechanism 4 to the substrate alignment mechanism 8. The substrate alignment mechanism 8 determines the circumferential position of the substrate 9 by rotating the substrate 9 in the circumferential direction to change the circumferential orientation of the substrate 9.

The substrate alignment mechanism 8 includes a substrate supporter 80, a motor 81, and a sensor 82. The substrate supporter 80 rotatably supports a substrate 9 in a horizontal posture. The motor 81 is a rotor that rotates a substrate 9 along with the substrate supporter 80. The sensor 82 acquires the angular position of a rotating substrate 9 (i.e., circumferential orientation of the substrate 9) by optically detecting the notch 93 of the substrate 9 supported by the substrate supporter 80. In the substrate alignment mechanism 8, the motor 81 rotates the substrate 9 supported by the substrate supporter 80 in the circumferential direction to change the circumferential orientation of the substrate 9. Then, the sensor 82 detects the notch 93 of the rotating substrate 9, and the motor 81 is stopped with predetermined timing after the detection (i.e., after the elapse of a predetermined period of time since the detection of the notch 93). Note that the predetermined period of time may be zero. In this way, the rotation of the substrate 9 is stopped when the notch 93 of the substrate 9 is located at a predetermined position. That is, the notch 93 of the substrate 9 is aligned in the circumferential direction. The substrate alignment mechanism 8 is a notch-position changing mechanism for changing the circumferential position of the notch 93 of the substrate 9.

When the substrate alignment mechanism 8 has determined the circumferential position of the substrate 9, the substrate 9 is transported out of the substrate alignment mechanism 8 by the single-substrate hand 42 and returned to the FOUP 95 on the FOUP holder 1. Subsequently, in the same manner, the next substrate 9 is taken out of the FOUP 95, and then returned to the FOUP 95 after the substrate alignment mechanism 8 has determined the circumferential position of the substrate 9 (i.e., the notch 93 is aligned in the circumferential direction). By repeating this operation for all of the substrates 9 in the FOUP 95, the circumferential orientations of the substrates 9 in the FOUP 95 are changed, and the circumferential positions of the substrates 9 are determined. In other words, these substrates 9 are aligned in the circumferential direction.

In the operation of determining the circumferential positions of the substrates 9, the notches 93 of all of the substrates 9 housed in the FOUP 95 may be located at the same circumferential position, or may be located at different circumferential positions. For example, the circumferential position of the notch 93 of each odd-numbered substrate 9 in the alignment direction of the substrates 9 may be set to a first predetermined position, and the circumferential position of the notch 93 of each even-numbered substrate 9 in the alignment direction may be set to a second predetermined position different from the first predetermined position.

When the substrate alignment mechanism 8 has completed the alignment of the substrates 9 (i.e., alignment in the circumferential direction of the notches 93), the substrates 9 are transported out of the FOUP 95 by the batch hand 41 of the carry-in-and-out mechanism 4. The batch hand 41 then rotates horizontally and moves ahead toward the posture changing mechanism 5 so that the substrates 9 are transferred from the carry-in-and-out mechanism 4 to the posture changing mechanism 5. The posture changing mechanism 5 collectively holds the plurality of substrates 9, which are stacked in the Z direction in a horizontal posture, with a horizontal holder 51. The posture changing mechanism 5 causes a holder rotation mechanism 54 to rotate the plurality of substrates 9 by 90 degrees in the counterclockwise direction in FIG. 3 about a rotational shaft 541 pointing in the Y direction, along with the horizontal holder 51, a vertical holder 52, and a mounting block 53. This rotation changes the posture of the substrates 9 at once from horizontal to vertical. The substrates 9 in a vertical posture are collectively held by the vertical holder 52.

Then, an up-and-down holder 61 is moved upward by driving a holder elevating mechanism 62 of the pusher 6, and receives and holds the substrates 9 from the vertical holder 52 indicated by the dashed double-dotted line in FIG. 3. That is, the substrates 9 held in a vertical posture are transferred between the vertical holder 52 and the pusher 6. The up-and-down holder 61 collectively holds the substrates 9 that are aligned (i.e., stacked) in approximately the X direction in a vertical posture. When the horizontal holder 51 and the vertical holder 52 of the posture changing mechanism 5 are rotated by 90 degrees in the clockwise direction in FIG. 3 and retracted from above the holder elevating mechanism 62, the up-and-down holder 61 is rotated horizontally by 180 degrees about a rotational shaft 63 pointing in the Z direction and then moved down by the holder elevating mechanism 62. Accordingly, the positions in the stacking direction of the substrates 9 are shifted by a half of the pitch of the substrates 9 (i.e., a half of the distance in the stacking direction between two adjacent substrates 9, which is hereinafter referred to as a "half pitch") from the positions before the rotation.

Thereafter, in the same procedure as described above, a new plurality of (e.g., 25) substrates 9 housed in the FOUP 95 are transferred from the carry-in-and-out mechanism 4 to the posture changing mechanism 5 after sequentially aligned in the circumferential direction by the substrate alignment mechanism 8. The posture changing mechanism 5 collectively changes the posture of the new substrates 9 from horizontal to vertical. Then, the up-and-down holder 61 of the pusher 6 is again moved upward and receives and holds the new substrates 9 from the posture changing mechanism 5. At this time, the substrates 9 already held by the up-and-down holder 61 (hereinafter, referred to as a "first substrate group") are inserted among the new substrates 9 (hereinafter, referred to as a "second substrate group") from the underside. In this way, the posture changing mechanism 5 and the pusher 6 carry out batch assembly in which a batch is formed by combining the first substrate group and the second substrate group.

As described above, the substrates 9 (hereinafter, also referred to as "first substrates 9") in the first substrate group are rotated by 180 degrees (i.e., turned around) before insertion into the second substrate group. Thus, each of the first substrates 9 in the first substrate group is disposed between each pair of the substrates 9 (hereinafter, also referred to as "second substrates 9") in the second substrate group, with the first substrates 9 and the second substrates 9 alternately arranged front-to-front and back-to-back. In other words, each pair of adjacent substrates 9 among the plurality of (e.g., 50) substrates 9 held by the up-and-down holder 61 are disposed such that their front surfaces or their rear surfaces face each other (i.e., they are in a face-to-face situation). The front surfaces of the substrates 9 may be main surfaces where circuit patterns are formed, and the rear surfaces of the substrates 9 may be main surfaces on the side opposite to the front surfaces.

Alternatively, when the up-and-down holder 61 that holds the first substrate group is moved only horizontally by the half pitch in the alignment direction of the substrates 9 without being rotated by 180 degrees before receipt of the second substrate group, the pusher 6 may carry out batch assembly in a state in which each pair of adjacent substrates 9 is disposed such that their front and rear surfaces face each other (i.e., they are in a face-to-back situation).

The substrates 9 assembled into a batch on the up-and-down holder 61 are transferred from the up-and-down holder 61 to a carry-in chuck 71 of the delivery mechanism 7. The carry-in chuck 71 moves in the +X direction from above the holder elevating mechanism 62 while holding the received substrates 9 in a vertical posture. Subsequently, an intermediate chuck 72 of the delivery mechanism 7 moves downward to receive the substrates 9 from the carry-in chuck 71 and then moves upward. Then, a substrate chuck 31 of the main transport mechanism 3 receives the substrates 9 from the intermediate chuck 72. The substrate chuck 31 holds the substrates 9 that are aligned in the X direction in a vertical posture.

The main transport mechanism 3 transports the unprocessed substrates 9 held by the substrate chuck 31 in the +Y direction and positions the substrates 9 above the first lifter 27 of the substrate processing part 2 illustrated in FIG. 1. The first lifter 27 collectively receives the substrates 9, which are aligned in the X direction in a vertical posture, from the substrate chuck 31. The first lifter 27 moves the substrates 9 down into the first liquid chemical tank 21 and collectively immerses the substrates 9 in the liquid chemical retained in the first liquid chemical tank 21. Immersing the substrates 9 in the liquid chemical for a predetermined period of time completes liquid chemical processing performed on the substrates 9.

The first lifter 27 then pulls the substrates 9 up out of the first liquid chemical tank 21 and moves in the −Y direction. The first lifter 27 moves the substrates 9 down into the first rinsing liquid tank 22 and collectively immerses the substrates 9 in the rinsing liquid retained in the first rinsing liquid tank 22. Immersing the substrates 9 in the rinsing liquid for a predetermined period of time completes rinsing processing performed on the substrates 9. After the rinsing processing has completed, the first lifter 27 pulls the substrates 9 up out of the first rinsing liquid tank 22. The substrate chuck 31 of the main transport mechanism 3 collectively receives the substrates 9 from the first lifter 27 and moves to above the second lifter 28.

Like the first lifter 27, the second lifter 28 collectively receives the substrates 9 from the substrate chuck 31 and collectively immerses the substrates 9 in the liquid chemical retained in the second liquid chemical tank 23. After the liquid chemical processing performed on the substrates 9 has completed, the second lifter 28 pulls the substrates 9 up out of the second liquid chemical tank 23 and collectively immerses the substrates 9 in the rinsing liquid retained in the second rinsing liquid tank 24. After the rinsing processing performed on the substrates 9 has completed, the second lifter 28 pulls the substrates 9 up out of the second rinsing liquid tank 24. The substrate chuck 31 of the main transport mechanism 3 collectively receives the substrates 9 from the second lifter 28 and moves to above the dry processing part 25.

The dry processing part 25 collectively receives the substrates 9 from the substrate chuck 31 and performs dry processing on the substrates 9 at once. The dry processing involves, for example, supplying an organic solvent (i.e., isopropyl alcohol) to the substrates 9 in a reduced-pressure atmosphere and rotating the substrates 9 to remove the liquids on the substrates 9 by centrifugal force. After the dry processing performed on the substrates 9 has completed, the substrate chuck 31 of the main transport mechanism 3 collectively receives the processed substrates 9 from the dry processing part 25 and moves in the −Y direction.

Then, a delivery chuck 73 of the delivery mechanism 7 illustrated in FIGS. 2 and 3 collectively receives the substrates 9 from the substrate chuck 31 of the main transport mechanism 3 and moves in the −X direction to position the substrates 9 above the up-and-down holder 61 of the pusher 6. The up-and-down holder 61 of the pusher 6 moves upward and receives the substrates 9 from the delivery chuck 73. The up-and-down holder 61 holds the plurality of (e.g., 50) substrates 9 aligned in the X direction in a vertical posture.

Next, the up-and-down holder 61 moves downward to transfer the substrates 9 in a vertical posture between the pusher 6 and the vertical holder 52. More specifically, among the substrates 9, the plurality of (e.g., 25) substrates 9 in the second substrate group are transferred to the vertical holder 52 indicated by the dashed double-dotted line in FIG. 3. In other words, the batch of the first substrate group and the second substrate group is disassembled, and the first substrate group and the second substrate group are separated from each other. The horizontal holder 51 and the vertical holder 52 of the posture changing mechanism 5 are rotated by 90 degrees in the clockwise direction in FIG. 3. This rotation changes the posture of the substrates 9 in the second substrate group at once from vertical to horizontal. These substrates 9 are collectively held by the horizontal holder 51 while being stacked in the Z direction in a horizontal posture. Then, the batch hand 41 of the carry-in-and-out mechanism 4 receives the substrates 9 from the horizontal holder 51 and carries the substrates 9 into the FOUP 95. The FOUP 95 to which the processed substrates 9 are carried is replaced by a new FOUP 95.

When the posture changing mechanism 5 has changed the posture of the substrates 9 in the second substrate group from vertical to horizontal as described above, the up-and-down holder 61 that holds the plurality of (e.g., 25) substrates 9 in the first substrate group is moved upward. The horizontal holder 51 and the vertical holder 52 that have transferred the substrates 9 in the second substrate group to the carry-in-and-out mechanism 4 are rotated by 90 degrees in the counterclockwise direction in FIG. 3.

Then, the up-and-down holder 61 is again moved downward to transfer the substrates 9 in a vertical posture between the pusher 6 and the vertical holder 52. More specifically, the substrates 9 in the first substrate group are transferred to the vertical holder 52 indicated by the dashed double-dotted line in FIG. 3. The horizontal holder 51 and the vertical holder 52 are again rotated by 90 degrees in the clockwise direction in FIG. 3. This rotation changes the posture of the substrates 9 in the first substrate group at once from vertical to horizontal. These substrates 9 are collectively held by the horizontal holder 51 while being stacked in the Z direction in a horizontal posture. Then, the batch hand 41 of the carry-in-and-out mechanism 4 receives the substrates 9 from the horizontal holder 51 and carries the substrates 9 into the FOUP 95. Note that the posture changing mechanism 5 may first receive the first substrate group and then receive the second substrate group in the operation of moving the substrates 9 from the pusher 6 to the posture changing mechanism 5.

The posture changing mechanism 5 and the pusher 6 change the posture of the substrates 9 from horizontal to vertical or from vertical to horizontal as described above under the control of the controller 100. In other words, the posture changing mechanism 5, the pusher 6, and the controller 100 constitute a posture changing device that changes the posture of the substrates 9 from one of horizontal and vertical postures to the other posture.

While the substrate processing apparatus 10 illustrated in FIGS. 1 to 3 performs processing on the substrates 9 having an approximately disc-like shape as described above, these substrates 9 may be warped under the influence of processing (i.e., pre-processing) performed before transport to the substrate processing apparatus 10. Although various types of warpage may occur in the substrates 9, a plurality of substrates 9 housed in a single FOUP 95 are generally warped in the same way. More specifically, when the positions of the notches 93 are used as a reference, the substrates 9 are in the same warped state. The warped state of the substrates 9 indicates information including the orientation of the warp in the substrates 9 (e.g., orientation in which the substrate is convex to the front surface side) and the magnitude of the warp in the substrates 9.

Figure 4:
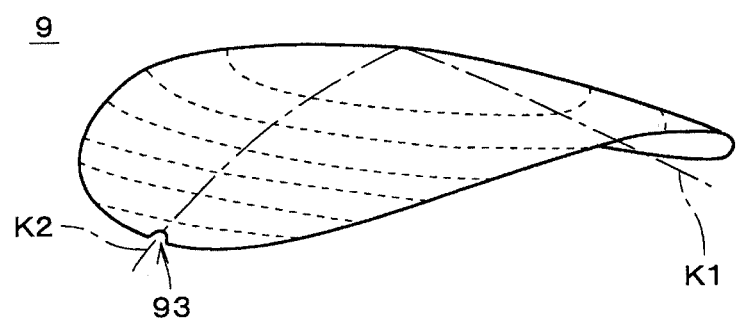
FIG. 4 is a perspective view of a substrate.
Figure 5:
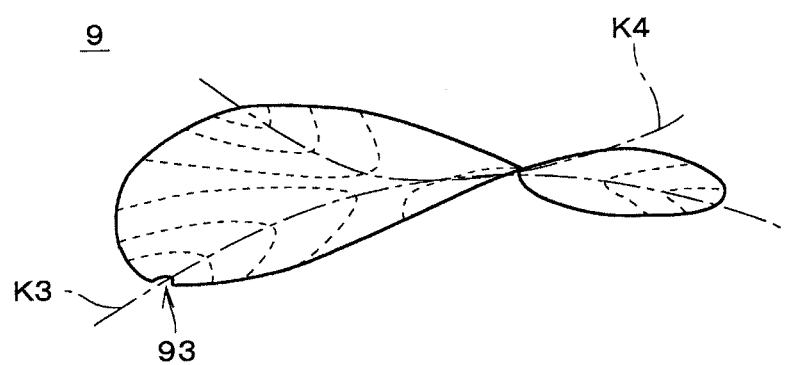
FIG. 5 is a perspective view of a substrate.

FIGS. 4 and 5 are perspective views illustrating examples of substrates 9 in different warped states. The substrate 9 in FIG. 4 is curved in a first radial direction K1 to one side in the thickness direction (i.e., direction in which the substrate is convex upward in FIG. 4) with a first curvature. The substrate 9 in FIG. 4 is also curved in a second radial direction K2 orthogonal to the first radial direction K1 to the one side in the thickness direction (i.e., the same direction as the direction of the curve in the first radial direction K1) with a second curvature greater than the first curvature.

The substrate 9 in FIG. 5 is curved in a first radial direction K3 to one side in the thickness direction (i.e., direction in which the substrate is convex upward in FIG. 5). The first radial direction K3 may be different from the first radial direction K1 illustrated in FIG. 4. The substrate 9 in FIG. 5 is also curved in a second radial direction K4 orthogonal to the first radial direction K3 to the other side in the thickness direction (i.e., direction opposite to the direction of the curve in the first radial direction K3).

In the following description, the warped states of the substrates 9 illustrated in FIGS. 4 and 5 are also respectively referred to as a "first warped state" and a "second warped state." The distance in the thickness direction between lowest and highest points in the thickness direction of each warped substrate 9 in a horizontal posture is referred to as the "size in the thickness direction" of the substrate 9. When the substrate 9 is held in a vertical posture, the size in the thickness direction of the substrate 9 is equal to the distance in the thickness direction between the point of the substrate 9 closest to the one side in the thickness direction and the point of the substrate 9 closest to the other side in the thickness direction. When the substrate 9 is flat and not warped, the size in the thickness direction of the substrate 9 is the same as the thickness of the substrate 9. The size in the thickness direction of a warped substrate 9 may be greater by approximately 0.5 mm than the thickness of a flat substrate 9.

Figure 6:
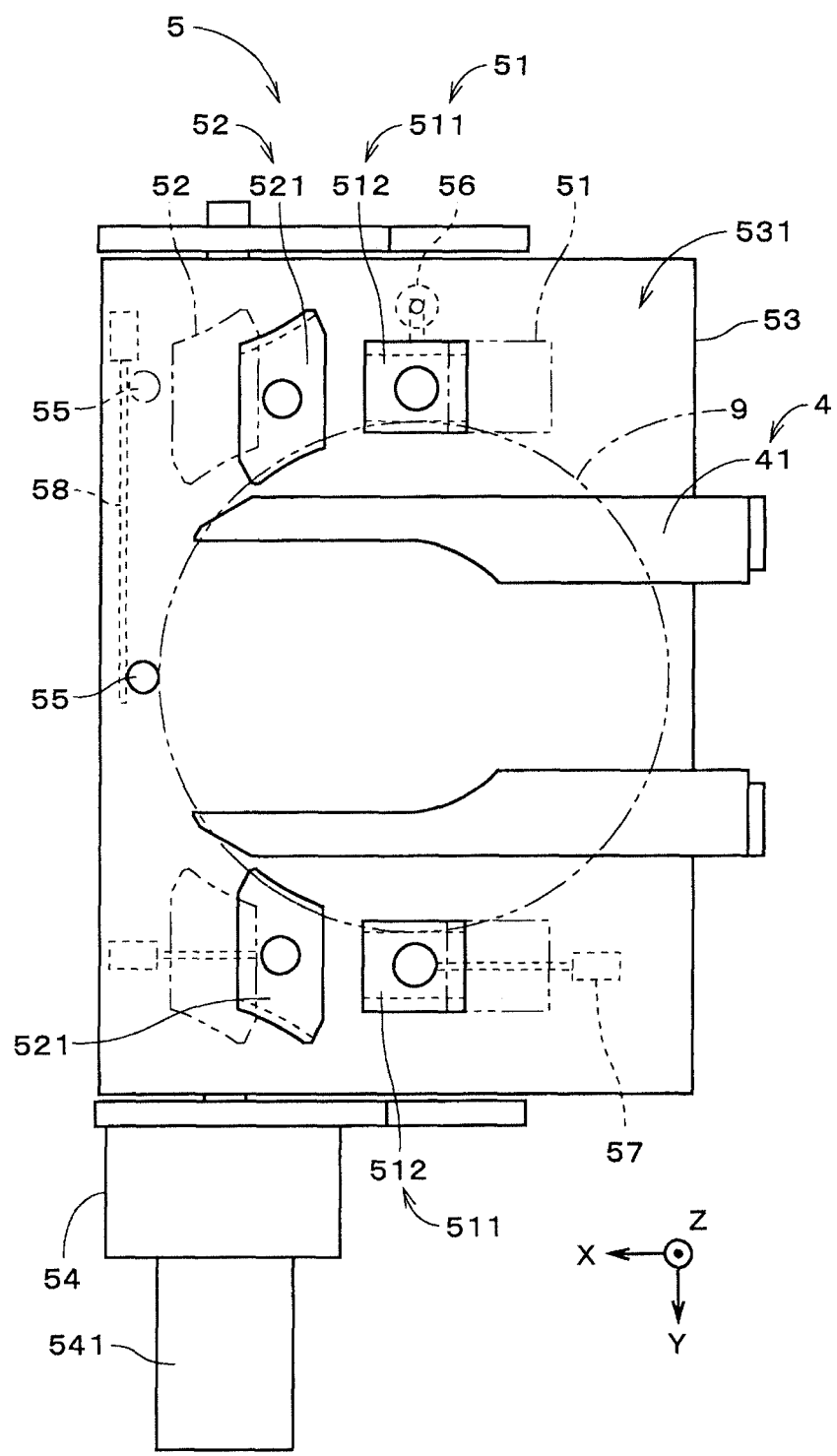
FIG. 6 is a plan view of a posture changing mechanism.

FIG. 6 is a plan view of the posture changing mechanism 5. FIG. 6 illustrates the posture changing mechanism 5 in a horizontal holding state, which will be described later. The batch hand 41 of the carry-in-and-out mechanism 4 is also illustrated in FIG. 6. The posture changing mechanism 5 includes the horizontal holder 51, the vertical holder 52, the mounting block 53, the holder rotation mechanism 54, an edge abutment part 55, a holder shifting mechanism 56, a holder sliding mechanism 57, and an abutment-part movement mechanism 58. The holder shifting mechanism 56, the holder sliding mechanism 57, and the abutment-part movement mechanism 58 may be disposed inside the mounting block 53.

The horizontal holder 51, the vertical holder 52, and the edge abutment part 55 are mounted on a mounting surface 531 that is an upper surface (i.e., +Z-side surface) in FIG. 6 of the mounting block 53. The vertical holder 52 is disposed on the +X side of the horizontal holder 51. The horizontal holder 51 includes a pair of horizontal support members 511 that extend in a direction approximately perpendicular to the mounting surface 531 (i.e., Z direction in FIG. 6). Each horizontal support member 511 includes a plurality of horizontal support pieces 512 that are aligned at approximately equal intervals in the Z direction in FIG. 6. The interval between each pair of horizontal support pieces 512 adjacent to each other in Z direction is equal to the pitch of the substrates 9 in the first substrate group (or the second substrate group). The vertical holder 52 includes a pair of vertical support members 521 that extend in the direction approximately perpendicular to the mounting surface 531. The two vertical support members 521 are respectively located on the +X side of the two horizontal support members 511. The edge abutment part 55 is disposed on the +X side of the vertical holder 52. The edge abutment part 55 is an approximately columnar member that extends in a direction approximately perpendicular to the mounting surface 531.

The horizontal holder 51 receives and holds a plurality of substrates 9 that are aligned in the thickness direction in a horizontal posture. In the horizontal holder 51, the pair of horizontal support members 511 supports the lower surface of each of the substrates 9, which are aligned in the thickness direction in a horizontal posture, from the underside. More specifically, a pair of horizontal support pieces 512 positioned at opposite edge portions in one radial direction of each substrate 9 comes into contact with the lower surface of the substrate 9 and supports the substrate 9 from the underside.

The horizontal holder 51 and the vertical holder 52 are individually movable in the X direction in FIG. 6 along the mounting surface 531 of the mounting block 53 by the holder sliding mechanism 57. The horizontal holder 51 moves between a position indicated by the dashed double-dotted line in FIG. 6 and a position indicated by the solid line. The vertical holder 52 moves between a position indicated by the solid line in FIG. 6 and a position indicated by the dashed double-dotted line. The holder shifting mechanism 56 moves the horizontal holder 51 in the direction perpendicular to the mounting surface 531 of the mounting block 53 (i.e., Z direction in FIG. 6 as well as the thickness direction of the substrates 9). Thus, the horizontal holder 51 moves (i.e., shifts) relative to the vertical holder 52 in the thickness direction of the substrates 9. The edge abutment part 55 is movable in the Y direction in FIG. 6 along the mounting surface 531 of the mounting block 53 by the abutment-part movement mechanism 58. The edge abutment part 55 moves between an abutment position indicated by the solid line in FIG. 6 and a retracted position indicated by the dashed double-dotted line.

The holder rotation mechanism 54 rotates the mounting block 53 by 90 degrees in the counterclockwise direction in FIG. 3 about the rotational shaft 541 pointing in the horizontal direction (more specifically, Y direction in FIG. 6). This rotation moves the horizontal holder 51 and the vertical holder 52 to the positions indicated by the dashed double-dotted line in FIG. 3. This rotation also changes the posture of the substrates 9 held by the horizontal holder 51 from horizontal to vertical. In the state indicated by the dashed double-dotted line in FIG. 3, the vertical holder 52 holds the substrates 9 in a vertical posture. More specifically, the pair of vertical support members 521 (see FIG. 6) of the vertical holder 52 catches and holds the lower edge portions of each substrate 9 on two sides in the circumferential direction of the bottom edge portion of the substrate 9, with the bottom edge portion projecting downward from the vertical holder 52.

In the following description, a state of the posture changing mechanism 5 in which the vertical holder 52 is capable of holding the substrates 9 in a vertical posture, as indicated by the dashed double-dotted line in FIG. 3, is referred to as a "vertical holding state." A state of the posture changing mechanism 5 in which the horizontal holder 51 is capable of holding the substrates 9 in a horizontal posture, as indicated by the solid line in FIG. 3, is referred to as a "horizontal holding state." The holder rotation mechanism 54 serves as a switching mechanism for switching between the vertical holding state and the horizontal holding state. In the posture changing mechanism 5 that is in the vertical holding state, the horizontal holder 51 is disposed above and adjacent to the vertical holder 52.

Figure 7:
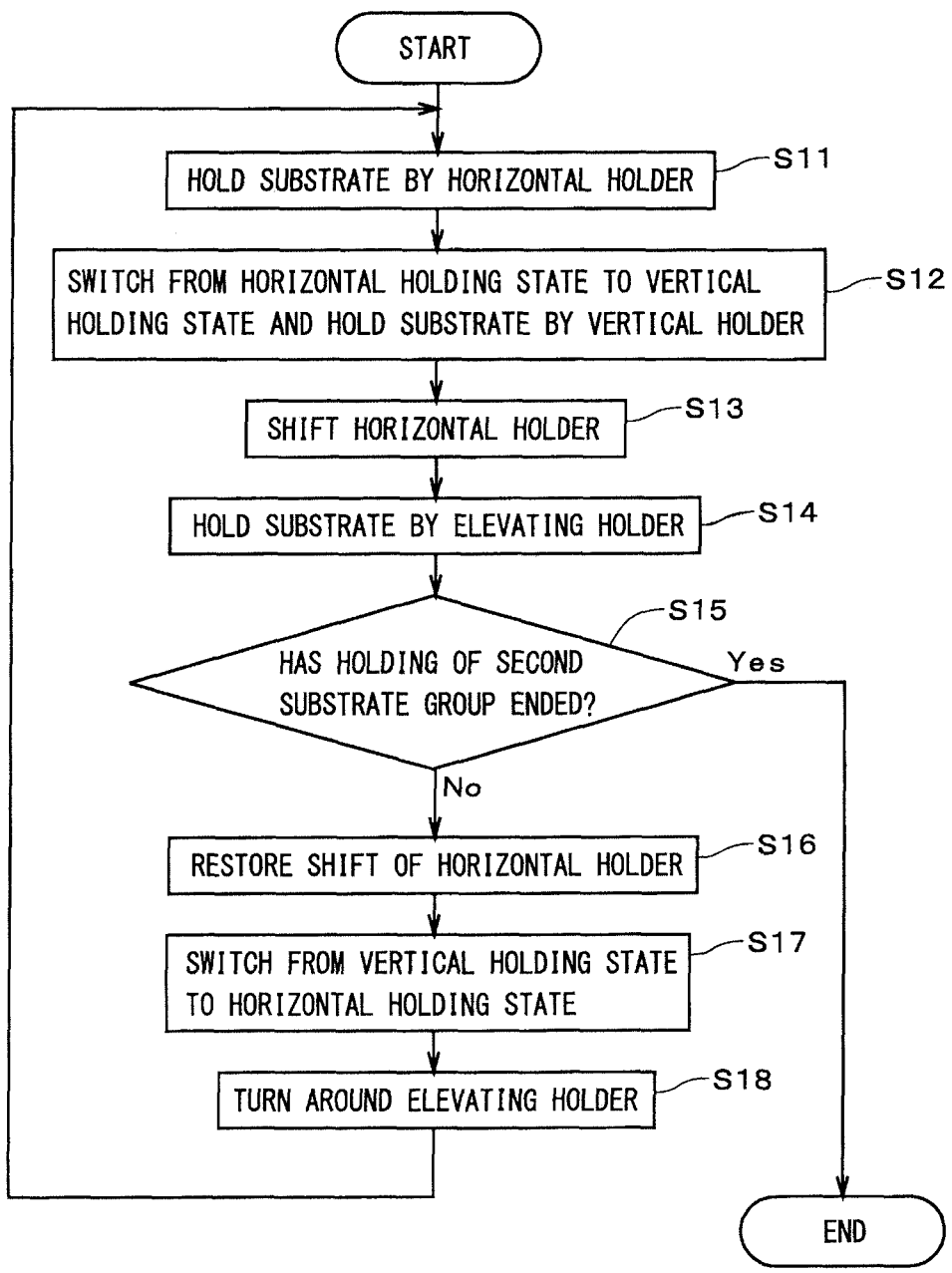
FIG. 7 is a flowchart illustrating a procedure for changing the posture of substrates.
Figure 25:
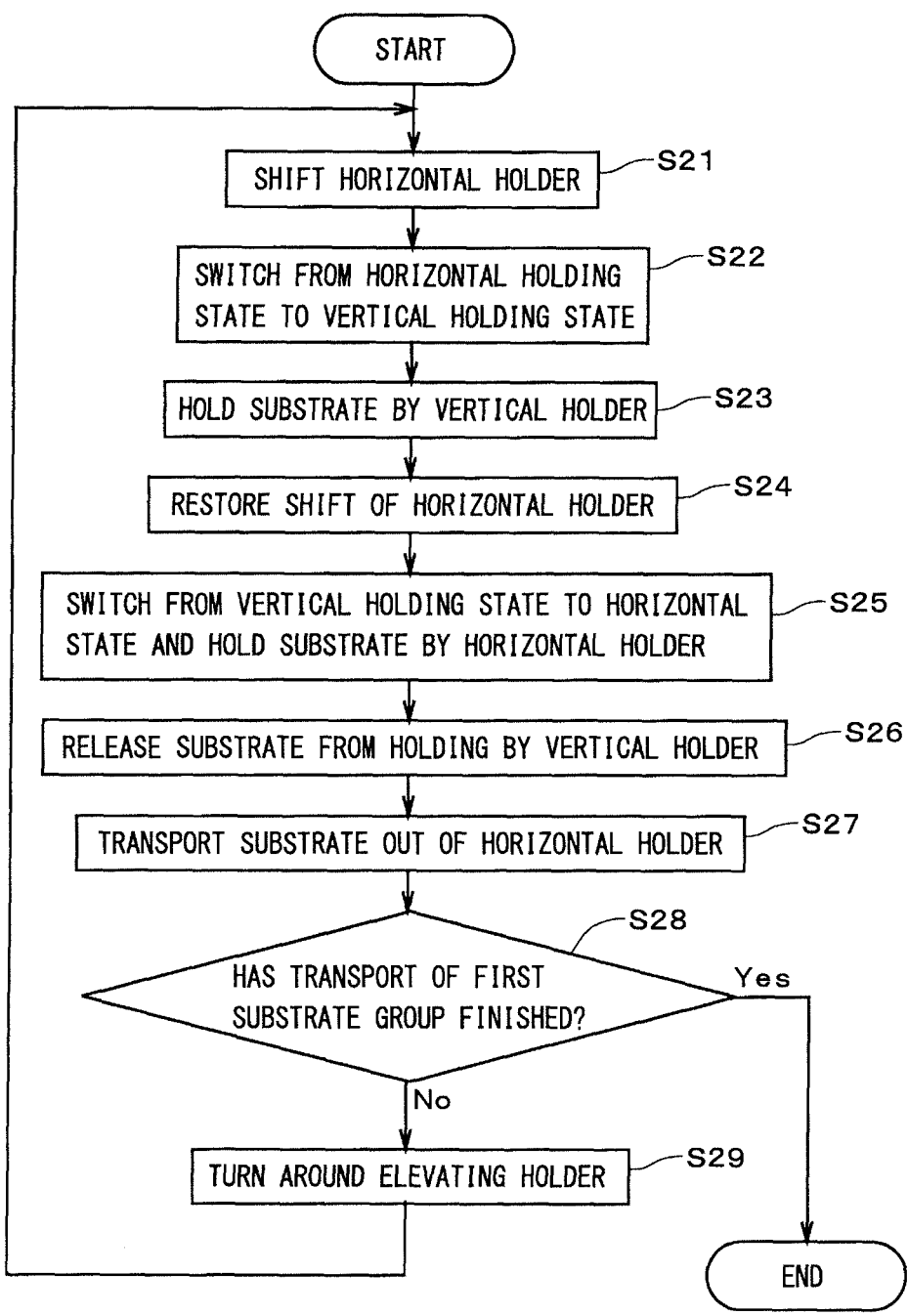
FIG. 25 is a flowchart illustrating a procedure for changing the posture of substrates.

Next, a procedure for changing the posture of the substrates 9, performed by the posture changing device, will be described with reference to FIGS. 7 to 50. FIGS. 7 and 25 are flowcharts illustrating the procedure for changing the posture of the substrates 9. FIGS. 8 to 24 and FIGS. 26 to 50 are side views illustrating the movement of the posture changing device. In order to facilitate understanding of the drawings, the number of substrates 9 illustrated in FIGS. 8 to 24 and FIGS. 26 to 50 is smaller than the actual number.

Figure 8:
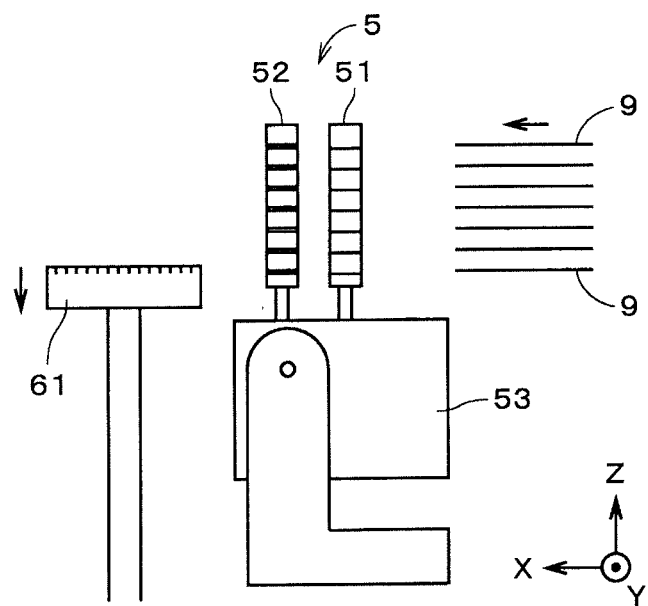
FIG. 8 is a side view illustrating movement of the posture changing device.
Figure 9:
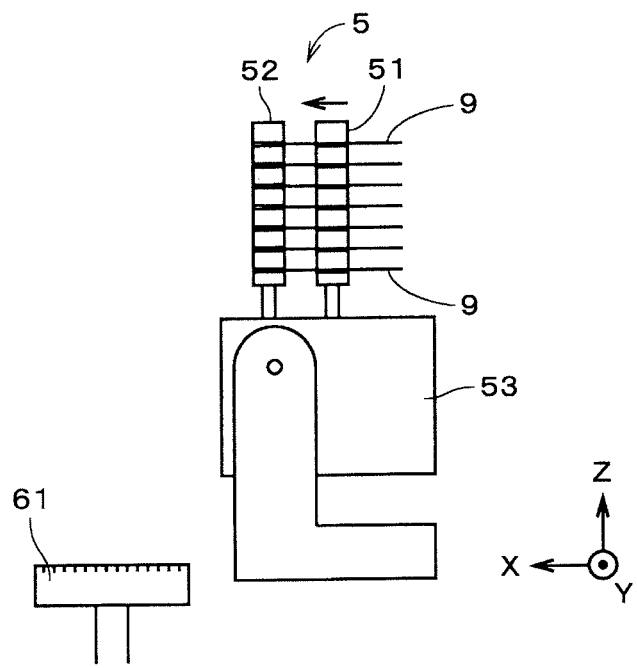
FIG. 9 is a side view illustrating the movement of the posture changing device.

FIG. 7 is a flowchart illustrating the procedure for the aforementioned batch assembly. In the case of carrying out batch assembly, first, a plurality of substrates 9 (i.e., the aforementioned first substrate group) aligned in the thickness direction in a horizontal posture are transferred from the batch hand 41 (sec FIG. 3) of the carry-in-and-out mechanism 4 to the posture changing mechanism 5 that is in the horizontal holding state, as illustrated in FIGS. 8 and 9. In the posture changing mechanism 5, the substrates 9 in a horizontal posture are held by the horizontal holder 51 (step S11). More specifically, the lower surface of each substrate 9 is supported from the underside by the horizontal holder 51. Moreover, the controller 100 (see FIG. 1) controls the holder elevating mechanism 62 (see FIG. 3) of the pusher 6 so as to move the up-and-down holder 61 downward.

Figure 10:
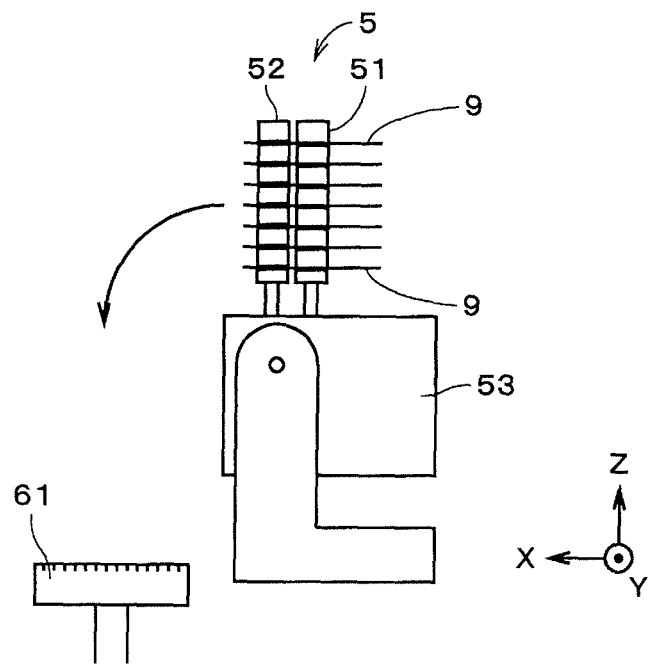
FIG. 10 is a side view illustrating the movement of the posture changing device.

Then, the controller 100 controls the holder sliding mechanism 57 (see FIG. 6) so that the horizontal holder 51 moves in the +X direction and approaches the vertical holder 52 as illustrated in FIG. 10. In the state illustrated in FIG. 10, the substrates 9 in a horizontal posture are held by the horizontal holder 51. The edge portions on the +X side of the substrates 9 project on the +X side from the vertical holder 52.

Figure 11:
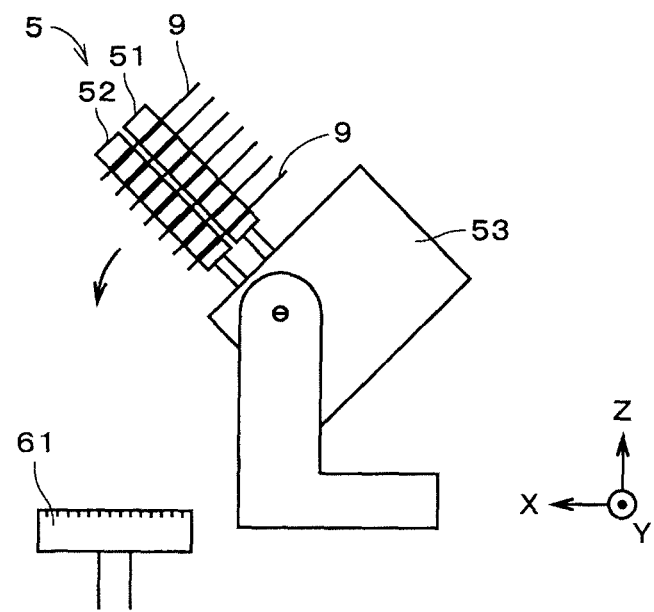
FIG. 11 is a side view illustrating the movement of the posture changing device.
Figure 12:
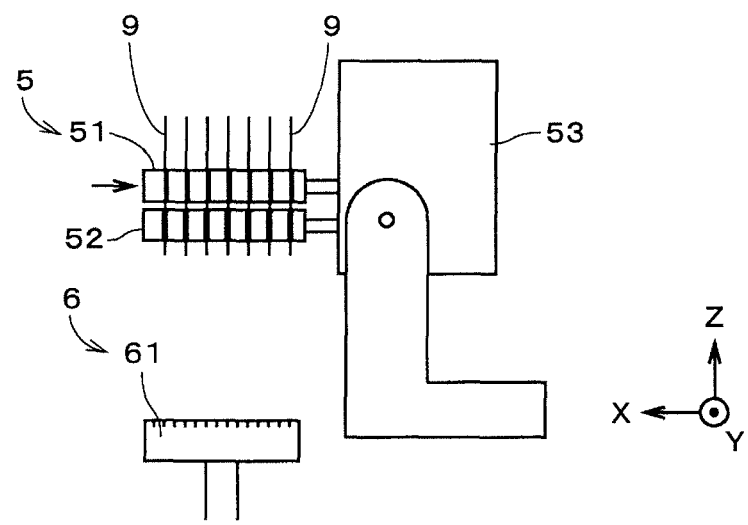
FIG. 12 is a side view illustrating the movement of the posture changing device.

Next, as illustrated in FIG. 11, the controller 100 controls the holder rotation mechanism 54 (see FIG. 6) so as to rotate the horizontal holder 51 and the vertical holder 52 along with the mounting block 53 in the counterclockwise direction in FIG. 11. The horizontal holder 51 and the vertical holder 52 are rotated by 90 degrees to switch the posture changing mechanism 5 from the horizontal holding state to the vertical holding state as illustrated in FIG. 12. The posture of the substrates 9 are also changed from horizontal to vertical, and the substrates 9 in a vertical posture are held by the vertical holder 52 (step S12). To be more specific, each substrate 9 is pushed against the vertical holder 52 under its own weight during rotation of the horizontal holder 51 and the vertical holder 52, and accordingly, the lower edge portions of each substrate 9 are caught and held by the pair of vertical support members 521. The substrates 9 held in a vertical posture by the vertical holder 52 are positioned above the up-and-down holder 61.

In the substrate processing apparatus 10, as described above, the substrates 9 are aligned in advance by the substrate alignment mechanism 8 illustrated in FIG. 1 so that their notch positions are at the desired positions. The notch position with which the substrates 9 are aligned by the substrate alignment mechanism 8 is determined in advance on the basis of the warped state of the substrates 9. More specifically, the notch position is determined so as to reduce the size in the thickness direction of each substrate 9 that is held in a vertical posture by the vertical holder 52 in step S12.

In this way, in the substrate processing apparatus 10, the notches 93 of the substrates 9 are positioned at predetermined notch positions by the controller 100 controlling the substrate alignment mechanism 8 on the basis of the warped state of the substrates 9. This reduces the size in the thickness direction of each substrate 9 that is held in a vertical posture by the vertical holder 52 in step S12. For example, when the substrates 9 are curved in one radial direction to one side in the thickness direction with a minimum curvature (i.e., minimum curvature among those in each radial direction of the warped substrates 9), this radial direction of the substrates 9, which is aligned by the substrate alignment mechanism 8 and accordingly held in a vertical posture by the vertical holder 52, becomes parallel to the up-down direction. For example, when the substrate 9 is in the first warped state illustrated in FIG. 4, the first radial direction K1 becomes parallel to the up-down direction. This minimizes the size in the thickness direction of each of the substrates 9 that are held in a vertical posture by the vertical holder 52.

When the substrates 9 are held by the vertical holder 52, the controller 100 controls the holder shifting mechanism 56 (see FIG. 6) so as to move the horizontal holder 51 relative to the vertical holder 52 in the thickness direction (i.e., X direction in FIG. 12) of the substrates 9 as illustrated in FIG. 12. In other words, the horizontal holder 51 is shifted relative to the vertical holder 52 in the thickness direction of the substrates 9 (step S13). In the example illustrated in FIG. 12, the vertical holder 52 does not move, and the horizontal holder 51 moves in the -X direction (i.e., direction approaching the mounting surface 531 of the mounting block 53). Thus, the plurality of horizontal support pieces 512 (see FIG. 6) of the horizontal holder 51 are separated on the -X side from the plurality of substrates 9 held in a vertical posture by the vertical holder 52.

In the substrate processing apparatus 10, the warped state of the substrates 9 held by the posture changing mechanism 5 is stored in advance in the storage 101. The storage 101 also previously stores shift information that indicates the degree of shift of the horizontal holder 51 required in step S13 in order to prevent the substrates 9 and the horizontal support pieces 512 from coming into contact with each other when the substrates 9 are later to be moved upward in step S14, which will be described later. This shift information includes a plurality of combinations of the warped state of the substrates 9 and the distance of shift (hereinafter, "shift distance") of the horizontal holder 51 corresponding to the warped state. The shift distance is set in consideration of, in particular, the size in the thickness direction, which is included in warpage information about the warp in the substrates 9. For example, the shift distance may be set to a value slightly greater than a minimum travel distance of the horizontal holder 51 with which it is possible to avoid contact between the substrates 9 and the horizontal support pieces 512.

In step S13, the controller 100 controls the holder shifting mechanism 56 on the basis of the warped state of the substrates 9, so that the position of the horizontal holder 51 in the thickness direction of the substrates 9 is shifted in the X direction relative to the vertical holder 52 by the shift distance that is determined on the basis of the warped state and the aforementioned shift information. Note that the substrate processing apparatus 10 does not necessarily have to store the shift information in the storage 101, and the controller 100 may obtain the shift distance through computations based on the warpage information.

Figure 13:
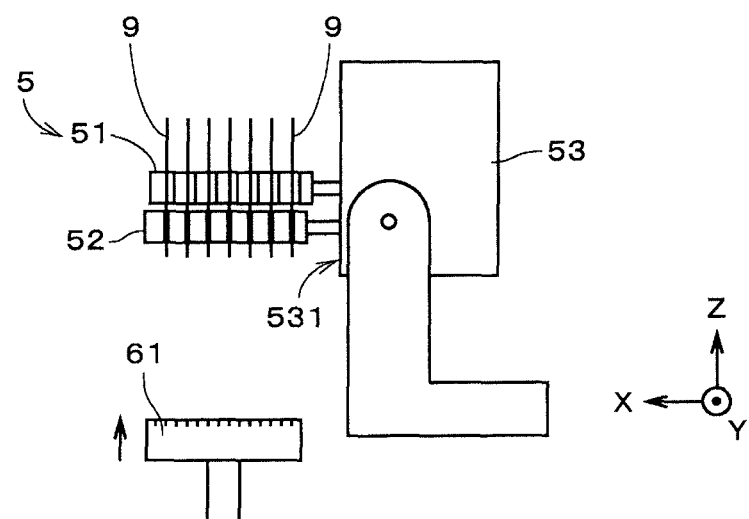
FIG. 13 is a side view illustrating the movement of the posture changing device.
Figure 14:
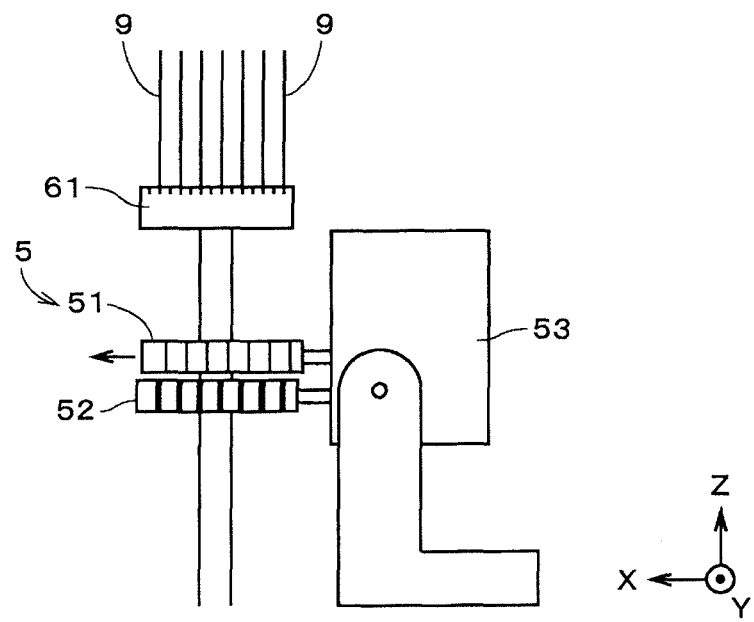
FIG. 14 is a side view illustrating the movement of the posture changing device.

When the horizontal holder 51 is separated from the substrates 9, the controller 100 controls the holder elevating mechanism 62 (see FIG. 3) so as to move the up-and-down holder 61 upward as illustrated in FIG. 13. The up-and-down holder 61 receives the plurality of substrates 9 in a vertical posture from the vertical holder 52 and holds the substrates 9 as illustrated in FIG. 14 while moving upward through the space between the pair of vertical support members 521 of the vertical holder 52 and between the pair of horizontal support members 511 of the horizontal holder 51 (see FIG. 6) (step S14). The substrate processing apparatus 10 can prevent the substrates 9 from coming into contact with the horizontal holder 51 when moving upward in step S14, because the horizontal holder 51 has been shifted in step S13 as described above.

Figure 15:
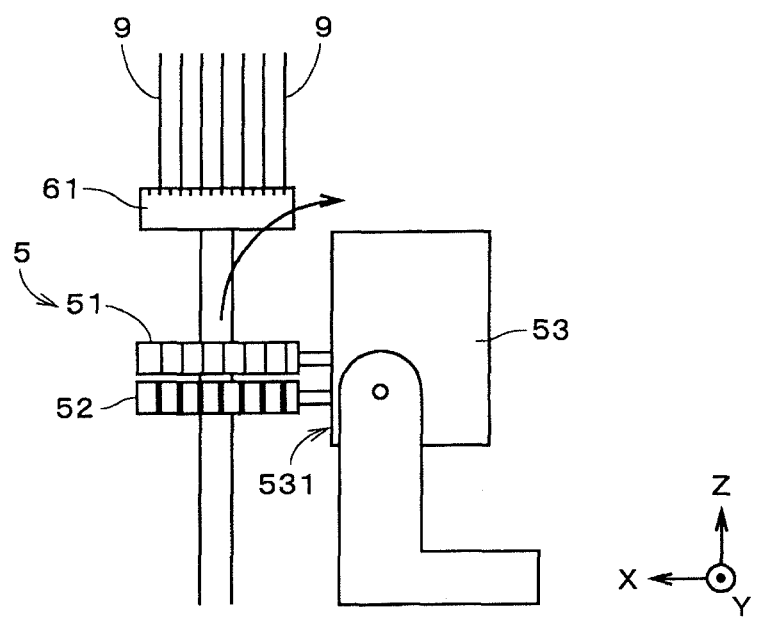
FIG. 15 is a side view illustrating the movement of the posture changing device.
Figure 16:
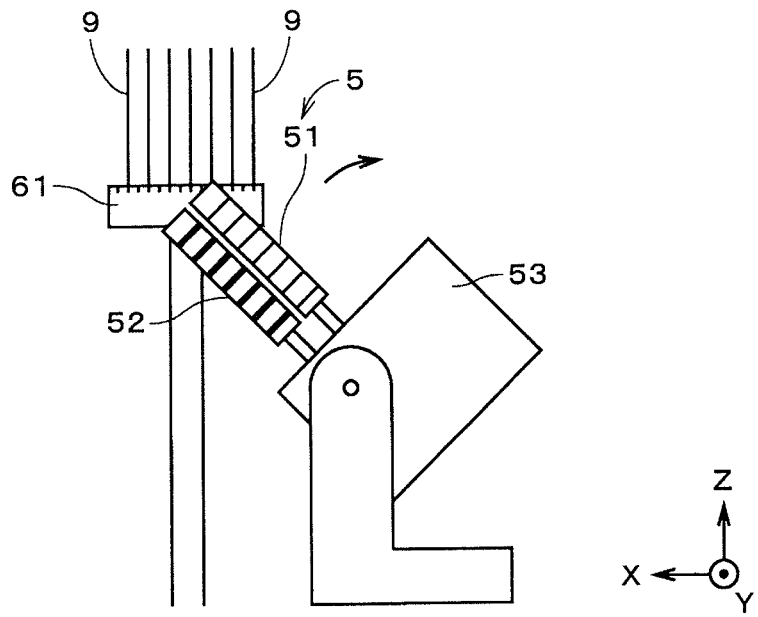
FIG. 16 is a side view illustrating the movement of the posture changing device.

When the up-and-down holder 61 has received the substrates 9 (i.e., the first substrate group), the horizontal holder 51 is moved by the aforementioned shift distance in the +X direction (i.e., direction away from the mounting surface 531 of the mounting block 53) as illustrated in FIG. 14 (steps S15 and S16). Thus, the above shift of the horizontal holder 51 is restored. Then, the holder rotation mechanism 54 (see FIG. 6) switches the posture changing mechanism 5 from the vertical holding state to the horizontal holding state as illustrated in FIGS. 15 and 16 (step S17).

Figure 17:
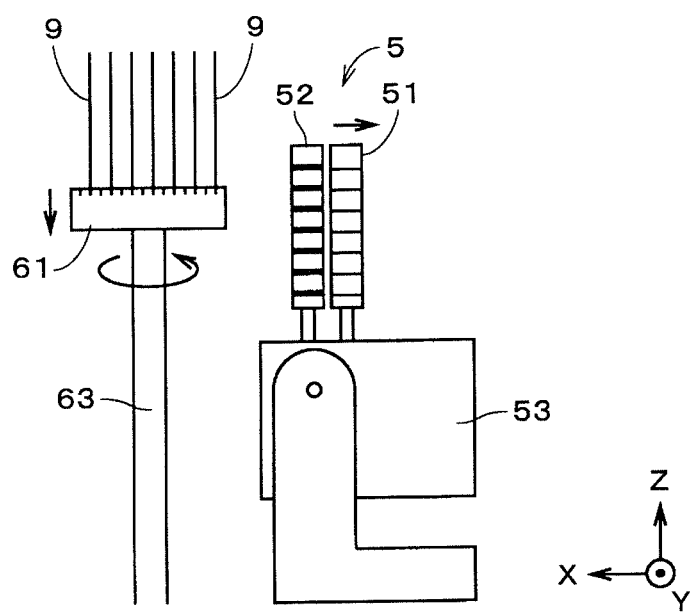
FIG. 17 is a side view illustrating the movement of the posture changing device.
Figure 18:
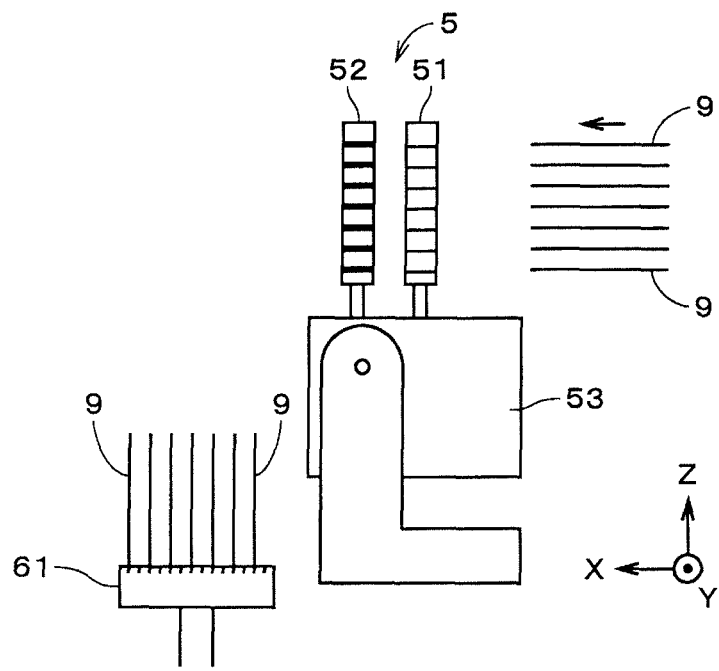
FIG. 18 is a side view illustrating the movement of the posture changing device.
Figure 19:
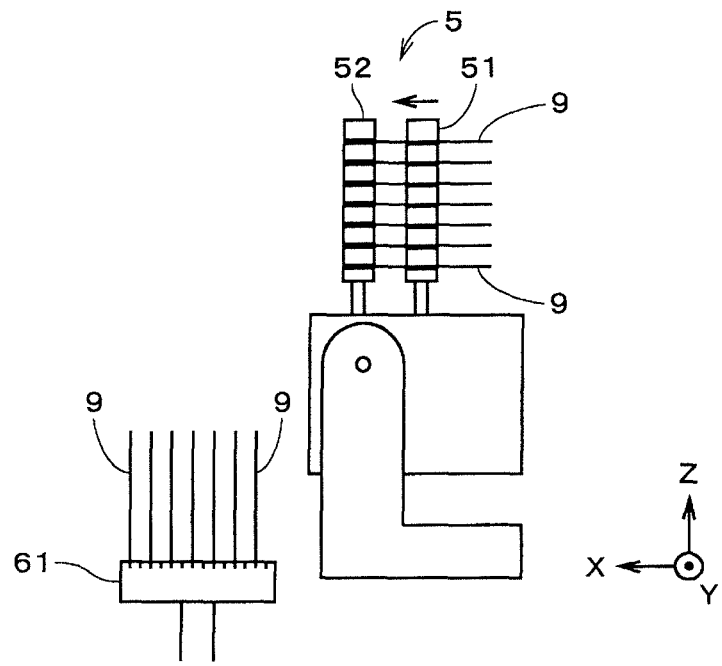
FIG. 19 is a side view illustrating the movement of the posture changing device.
Figure 20:
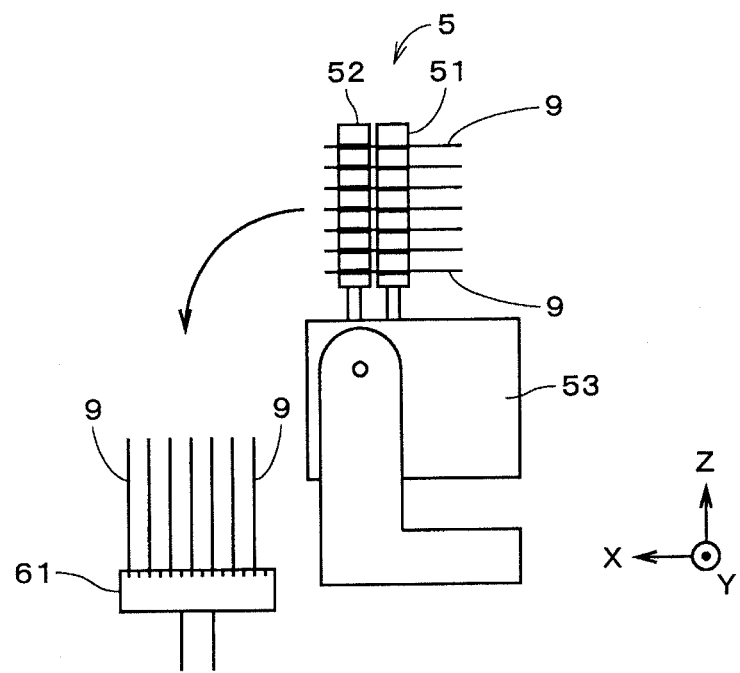
FIG. 20 is a side view illustrating the movement of the posture changing device.
Figure 21:
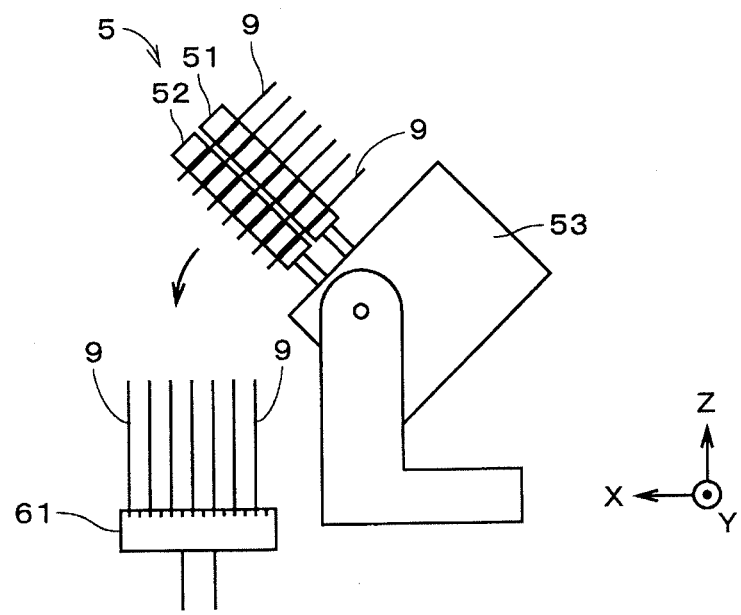
FIG. 21 is a side view illustrating the movement of the posture changing device.
Figure 22:
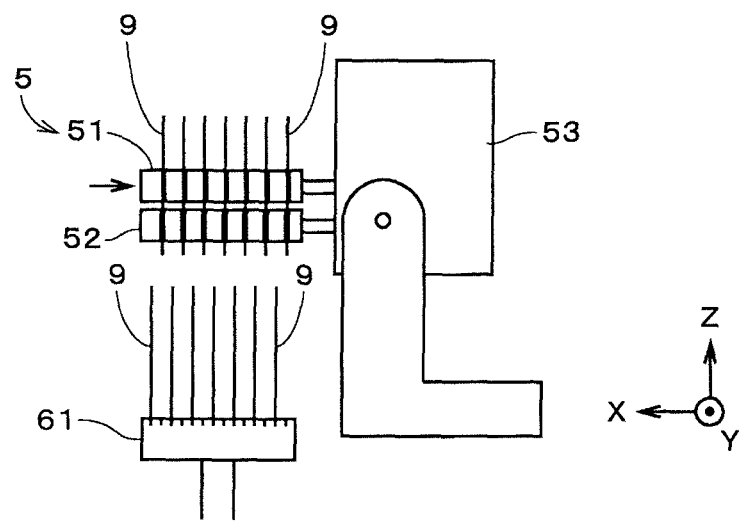
FIG. 22 is a side view illustrating the movement of the posture changing device.
Figure 23:
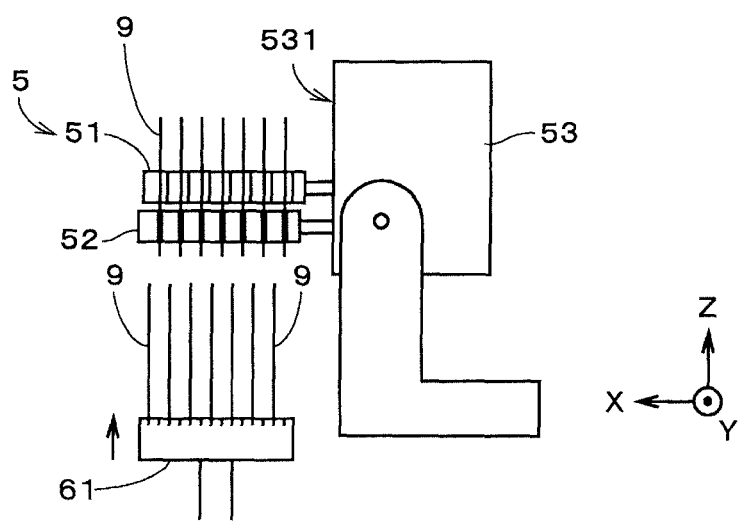
FIG. 23 is a side view illustrating the movement of the posture changing device.
Figure 24:
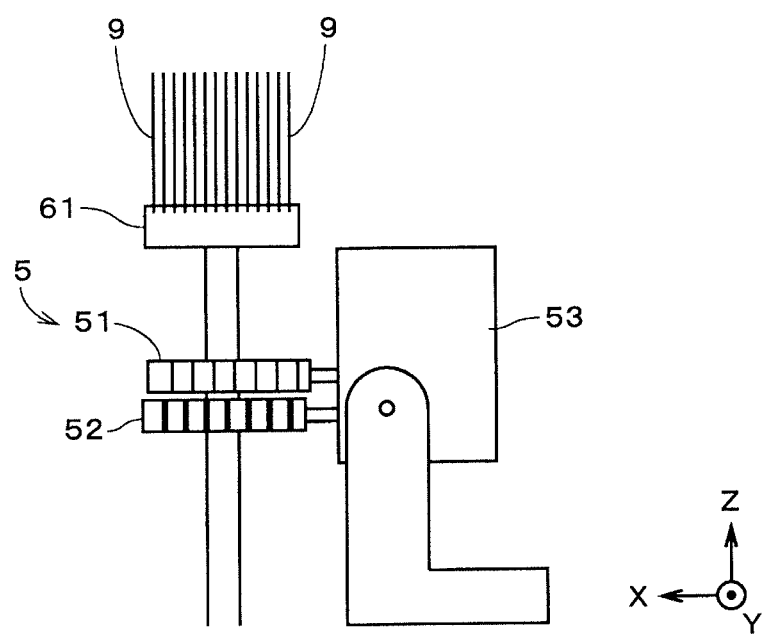
FIG. 24 is a side view illustrating the movement of the posture changing device.

Next, the up-and-down holder 61 that holds the first substrate group is horizontally rotated by 180 degrees (i.e., turned around) about the rotational shaft 63 and moved downward as illustrated in FIG. 17 (step S18). The horizontal holder 51 is moved in the -X direction and separated from the vertical holder 52. Then, steps S11 to S14 are repeated for a new plurality of substrates 9 (i.e., the aforementioned second substrate group) as illustrated in FIGS. 18 to 24. This completes the aforementioned batch assembly, and the first substrate group and the second substrate group are held by the up-and-down holder 61 of the pusher 6.

Figure 26:
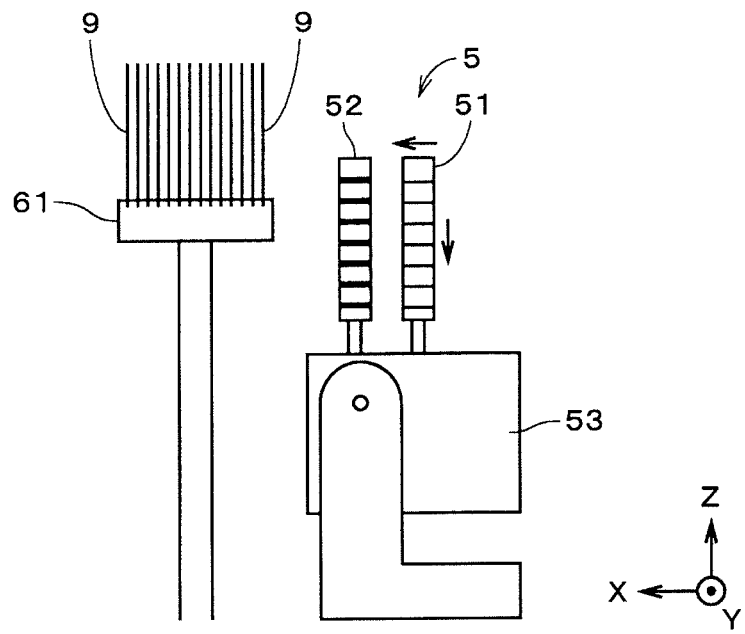
FIG. 26 is a side view illustrating movement of the posture changing device.

FIG. 25 is a flowchart illustrating a procedure for the aforementioned batch disassembly. In the case of carrying out batch disassembly, first, the controller 100 controls the holder sliding mechanism 57 (see FIG. 6) of the posture changing mechanism 5 that is in the horizontal holding state, so that the horizontal holder 51 is moved in the +X direction and approaches the vertical holder 52 as illustrated in FIG. 26. The controller 100 also controls the holder shifting mechanism 56 (see FIG. 6) so as to shift the horizontal holder 51 by the aforementioned shift distance in the −Z direction (i.e., direction approaching the mounting surface 531 of the mounting block 53) (step S21).

Figure 27:
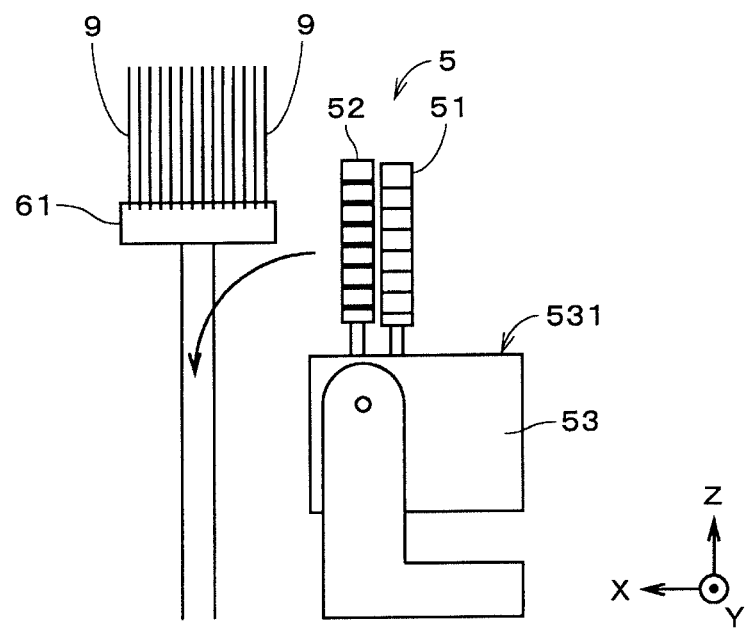
FIG. 27 is a side view illustrating the movement of the posture changing device.
Figure 28:
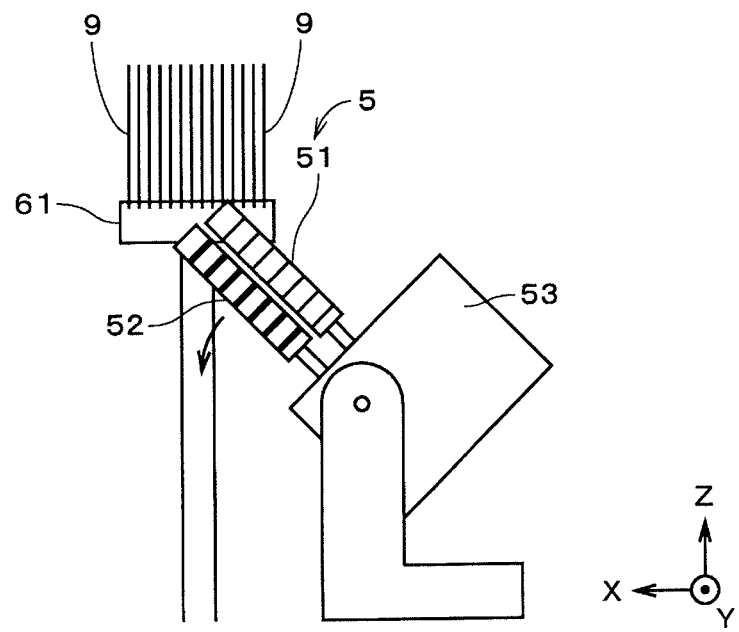
FIG. 28 is a side view illustrating the movement of the posture changing device.
Figure 29:
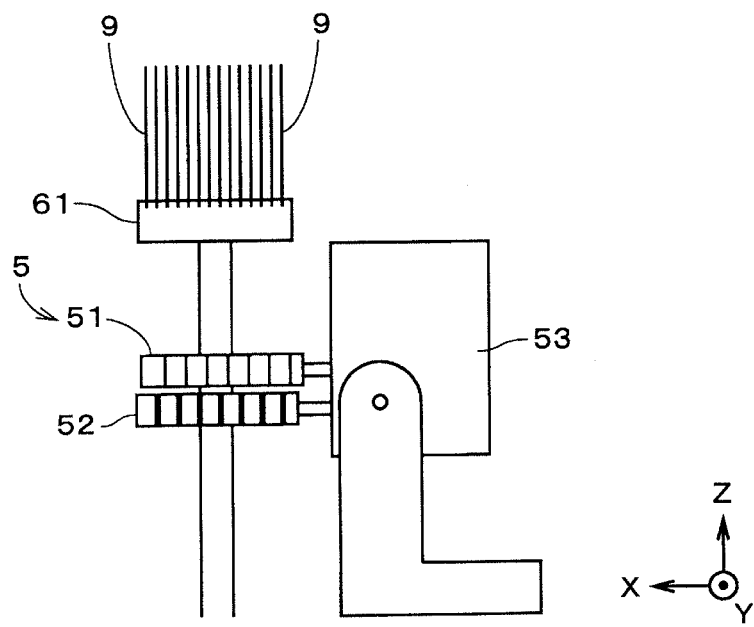
FIG. 29 is a side view illustrating the movement of the posture changing device.

Then, as illustrated in FIGS. 27 and 28, the controller 100 controls the holder rotation mechanism 54 (see FIG. 6) so as to rotate the horizontal holder 51 and the vertical holder 52 along with the mounting block 53 in the counterclockwise direction in FIGS. 27 and 28. By rotating the horizontal holder 51 and the vertical holder 52 by 90 degrees, the posture changing mechanism 5 is switched from the horizontal holding state to the vertical holding state as illustrated in FIG. 29 (step S22). The horizontal holder 51 and the vertical holder 52 are positioned below the up-and-down holder 61 that holds the plurality of processed substrates 9 (i.e., the first substrate group and the second substrate group).

Figure 30:
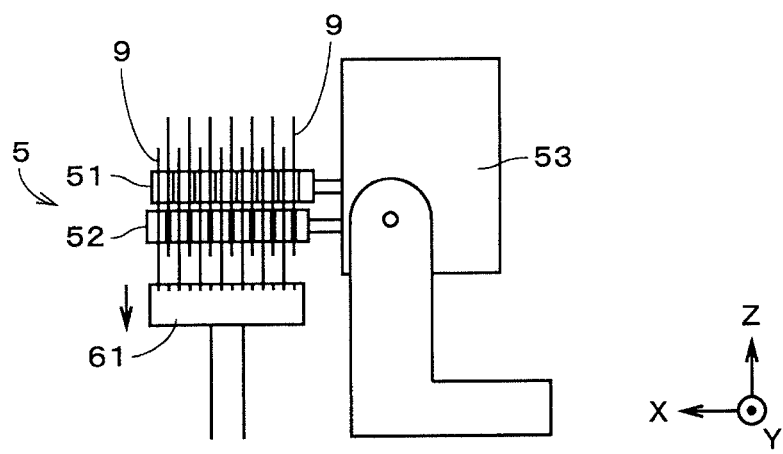
FIG. 30 is a side view illustrating the movement of the posture changing device.
Figure 31:
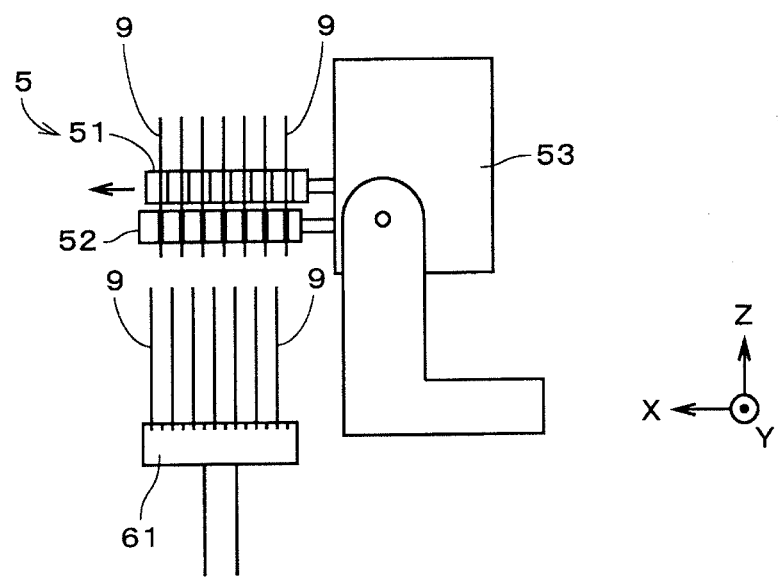
FIG. 31 is a side view illustrating the movement of the posture changing device.

Next, the holder elevating mechanism 62 (FIG. 3) is controlled by the controller 100 so as to move the up-and-down holder 61 downward. As illustrated in FIGS. 30 and 31, the vertical holder 52 receives and holds the substrates 9 in the second substrate group, out of the first and second substrate groups held by the up-and-down holder 61, from the up-and-down holder 61, while the up-and-down holder 61 is moved downward through the space between the pair of horizontal support members 511 of the horizontal holder 51 and between the pair of vertical support members 521 of the vertical holder 52 (see FIG. 6) (step S23). As a result, the batch of the first substrate group and the second substrate group is disassembled. The substrate processing apparatus 10 can prevent the substrates 9 in the second substrate group from coming into contact with the horizontal holder 51 when moving downward in step S23, because horizontal holder 51 has been shifted in step S21. The substrates 9 in the first substrate group also do not come into contact with the horizontal holder 51.

When the substrates 9 are held by the vertical holder 52, the controller 100 controls the holder shifting mechanism 56 so as to move the horizontal holder 51 by the aforementioned shift distance in the +X direction (i.e., direction away from the mounting surface 531 of the mounting block 53) as illustrated in FIG. 31 (step S24). Thus, the above shift of the horizontal holder 51 is restored, and the horizontal support pieces 512 of the horizontal holder 51 come into contact with the −X-side surfaces of the substrates 9 held in a vertical posture by the vertical holder 52.

Figure 32:
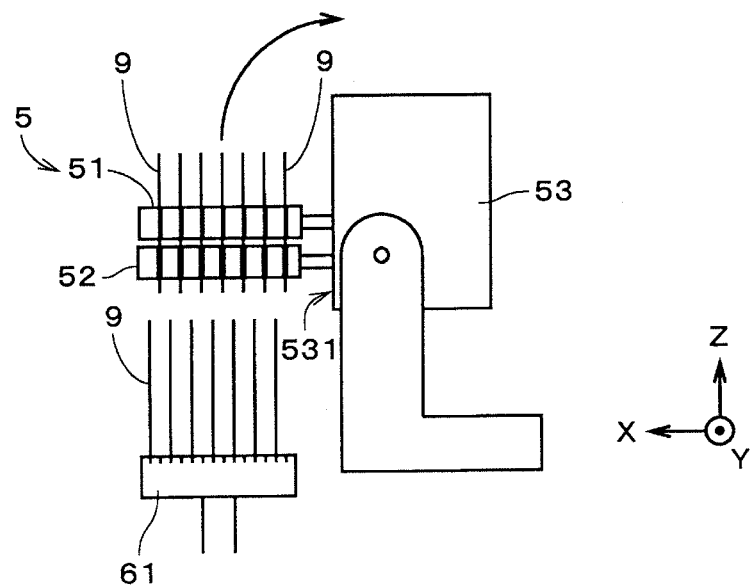
FIG. 32 is a side view illustrating the movement of the posture changing device.
Figure 33:
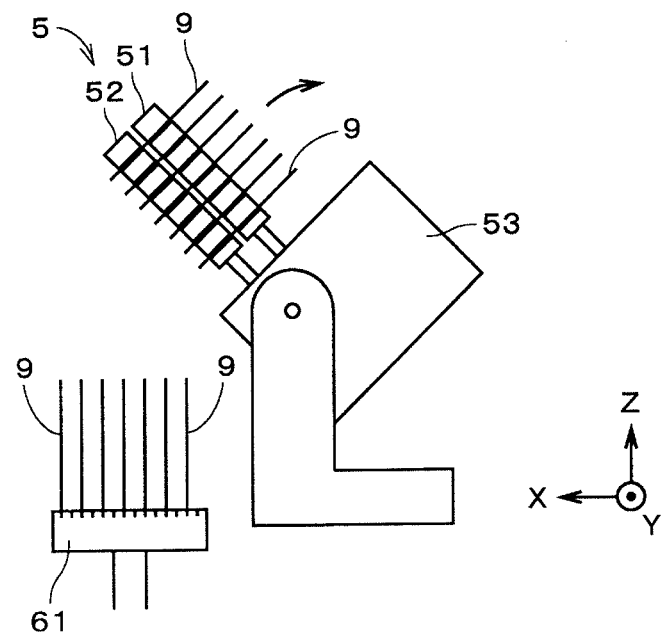
FIG. 33 is a side view illustrating the movement of the posture changing device.
Figure 34:
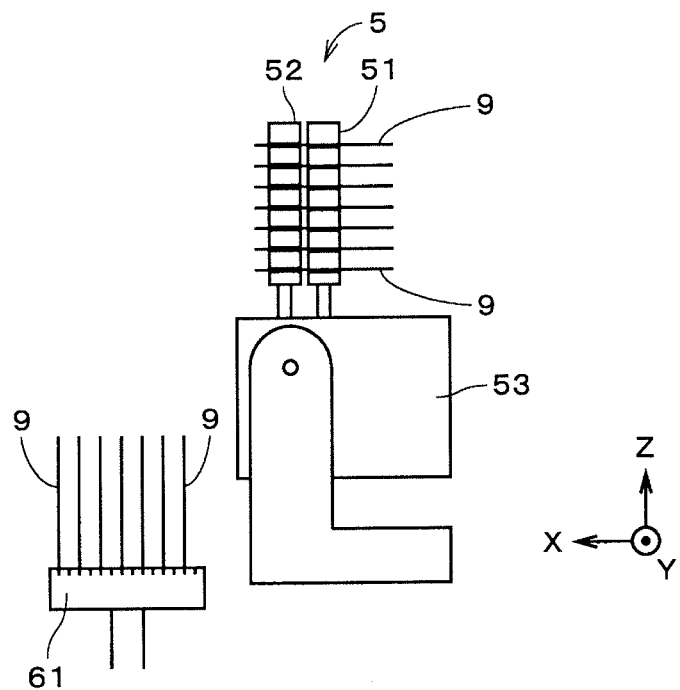
FIG. 34 is a side view illustrating the movement of the posture changing device.
Figure 35:
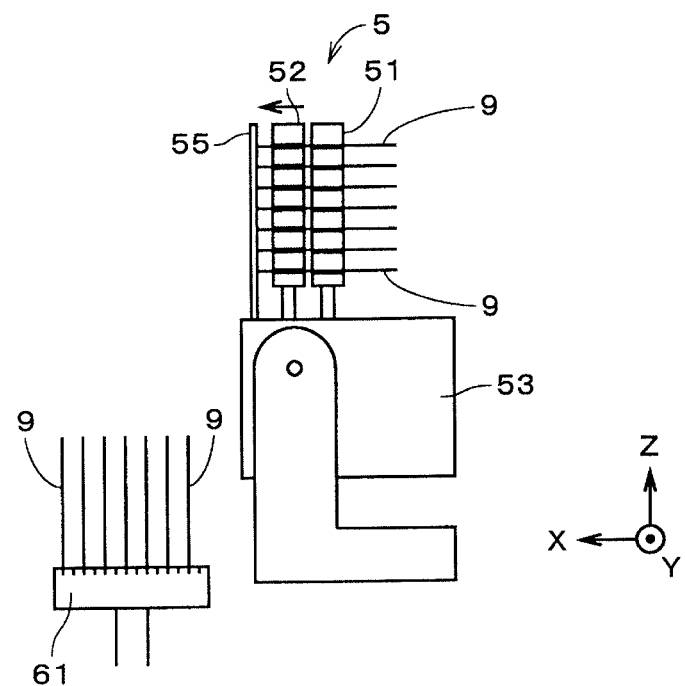
FIG. 35 is a side view illustrating the movement of the posture changing device.

Then, as illustrated in FIGS. 32 and 33, the controller 100 controls the holder rotation mechanism 54 so as to rotate the horizontal holder 51 and the vertical holder 52 along with the mounting block 53 in the clockwise direction in FIGS. 32 and 33. By rotating the horizontal holder 51 and the vertical holder 52 by 90 degrees, the posture changing mechanism 5 is switched from the vertical holding state to the horizontal holding state as illustrated in FIG. 34, and the substrates 9 in a horizontal posture are held by the horizontal holder 51 (step S25). In the state illustrated in FIG. 34, the vertical holder 52 has not yet released the holding of the substrates 9, and the substrates 9 supported from the underside by the horizontal holder 51 are still caught and held by the vertical holder 52 from the +X side.

Next, the controller 100 controls the abutment-part movement mechanism 58 (see FIG. 6), so that the edge abutment part 55 is moved from the aforementioned retracted position to the abutment position and abuts on the outer peripheral edge of each substrate 9 on the +X side of the substrates 9. Then, the controller 100 controls the holder sliding mechanism 57 so as to slide the vertical holder 52 in the +X direction. Thus, the vertical holder 52 is separated from the horizontal holder 51 and approaches the edge abutment part 55. Since the substrates 9 abut on the edge abutment part 55 as described above, the substrates 9 cannot move in the +X direction. Thus, the vertical holder 52 can be moved in the +X direction relative to the substrates 9 and can easily release the holding of the substrates 9 (step S26).

Figure 36:
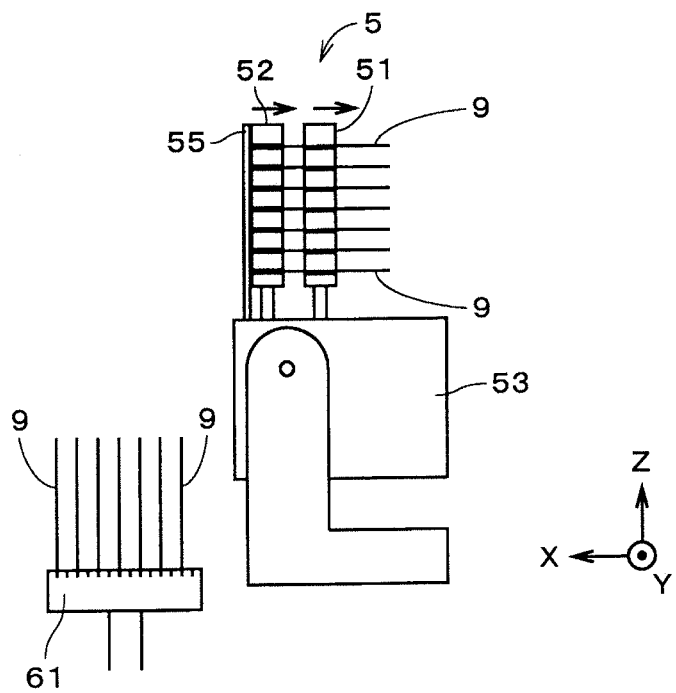
FIG. 36 is a side view illustrating the movement of the posture changing device.
Figure 37:
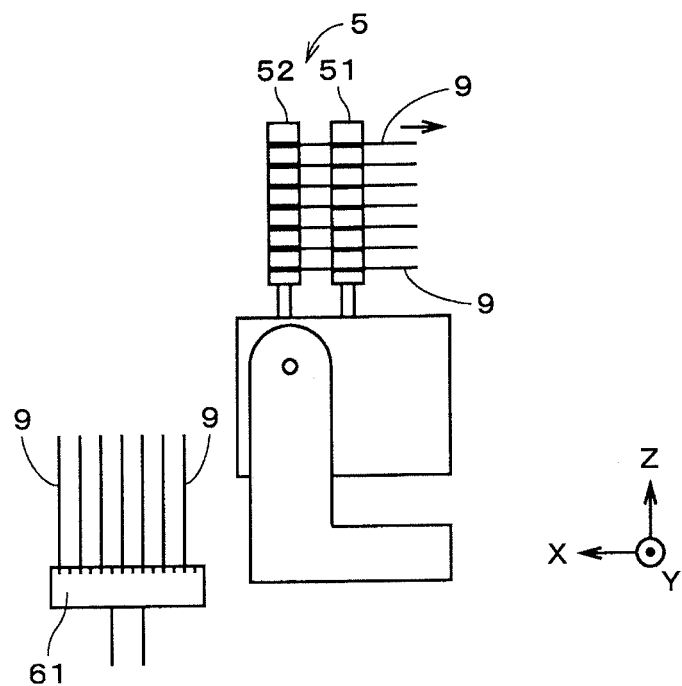
FIG. 37 is a side view illustrating the movement of the posture changing device.

When the vertical holder 52 has released the holding of the substrates 9, the holder sliding mechanism 57 moves the horizontal holder 51 and the vertical holder 52 in the −X direction as illustrated in FIG. 36. The substrates 9 held in a horizontal posture by the horizontal holder 51 are moved along with the horizontal holder 51 in the −X direction and separated from the edge abutment part 55. The edge abutment part 55 is, on the other hand, moved from the aforementioned abutment position to the retracted position. Then, the plurality of substrates 9 (i.e., the second substrate group) aligned in the thickness direction in a horizontal posture are conveyed out of the horizontal holder 51 by the batch hand 41 (see FIG. 3) of the carry-in-and-out mechanism 4 (step S27) and conveyed into the FOUP 95 (see FIG. 1) as illustrated in FIG. 37. The FOUP 95 that houses the substrates 9 is replaced by a new FOUP 95 that does not house any substrate 9.

Figure 38:
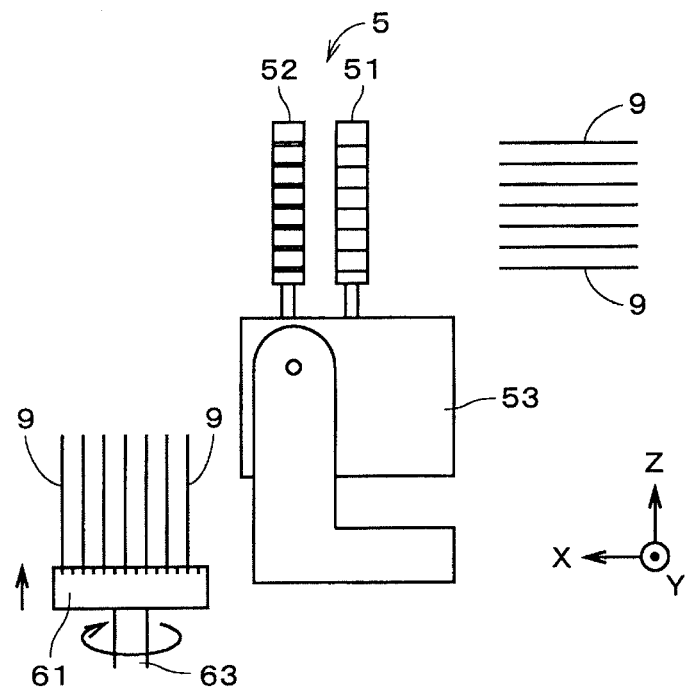
FIG. 38 is a side view illustrating the movement of the posture changing device.
Figure 39:
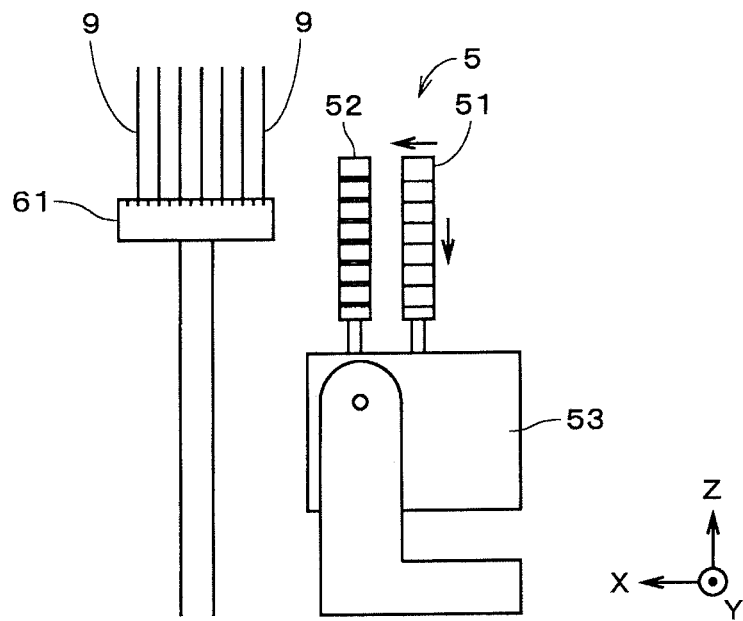
FIG. 39 is a side view illustrating the movement of the posture changing device.
Figure 40:
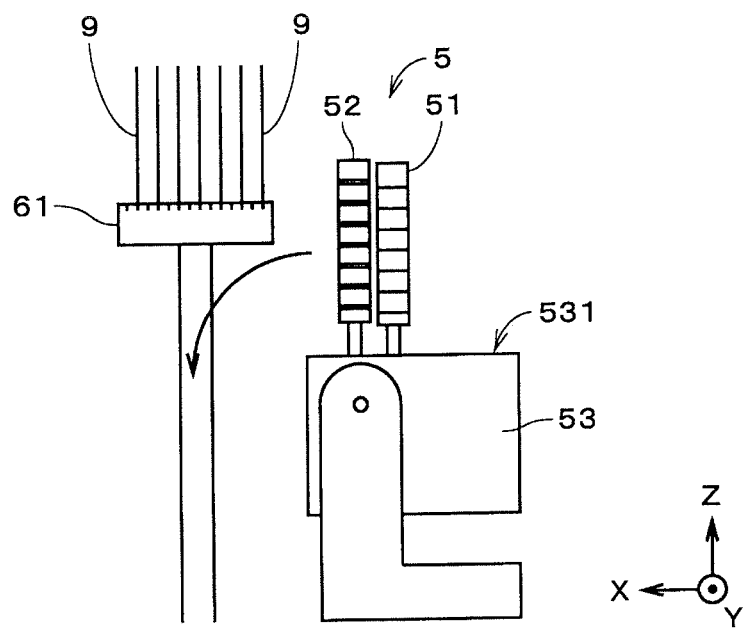
FIG. 40 is a side view illustrating the movement of the posture changing device.
Figure 41:
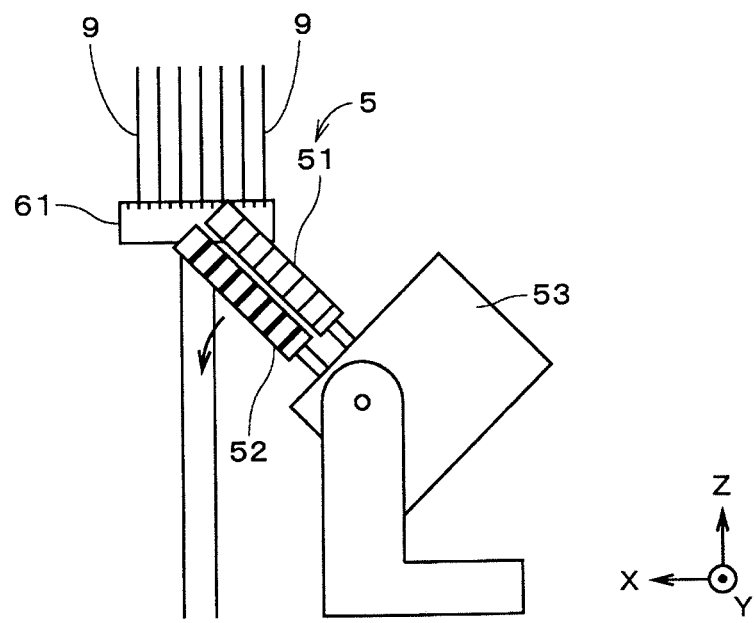
FIG. 41 is a side view illustrating the movement of the posture changing device.
Figure 42:
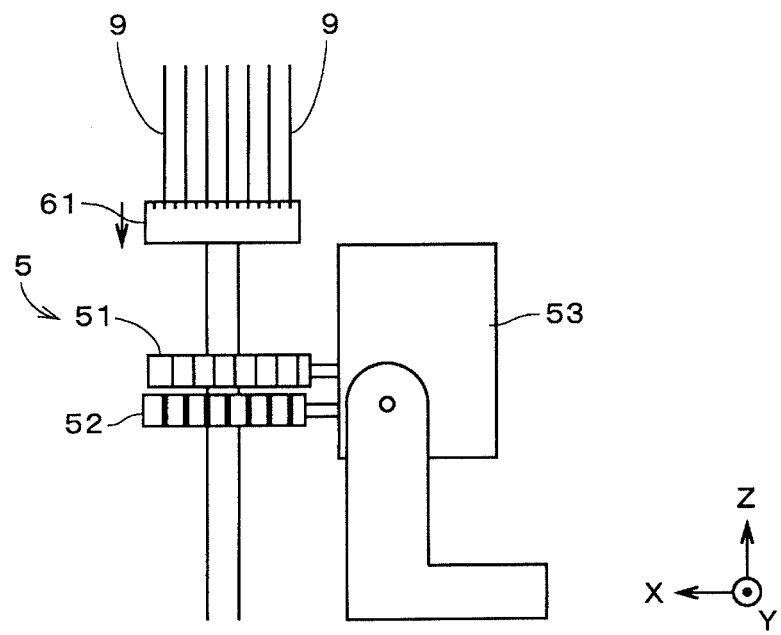
FIG. 42 is a side view illustrating the movement of the posture changing device.
Figure 43:
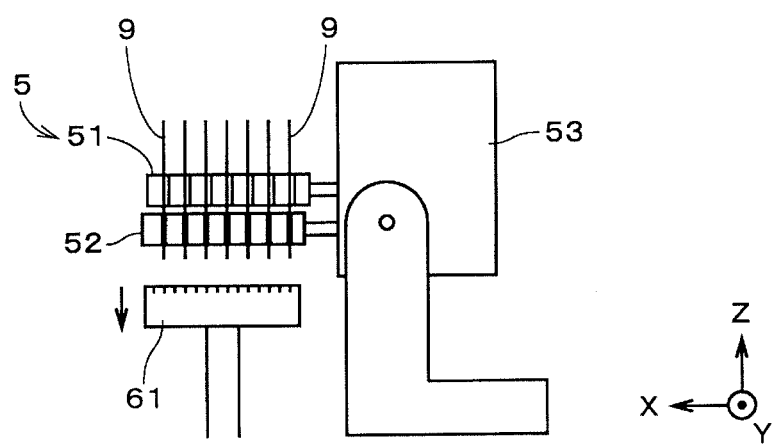
FIG. 43 is a side view illustrating the movement of the posture changing device.
Figure 44:
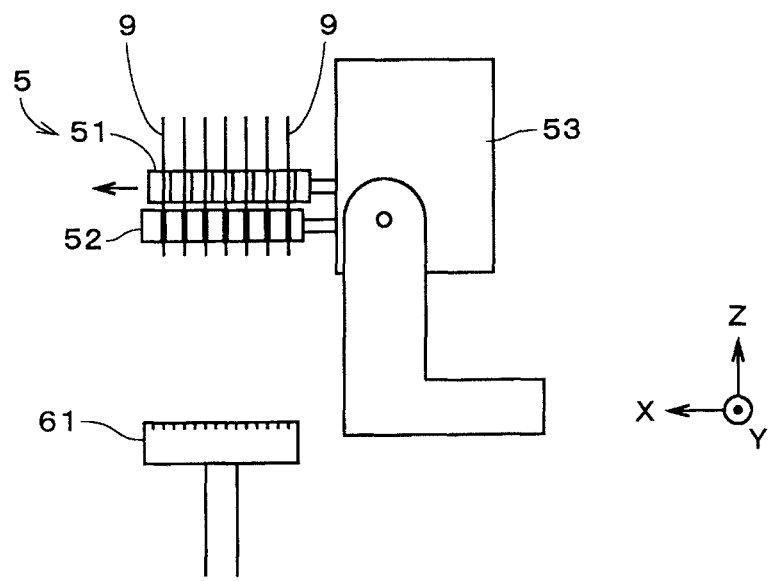
FIG. 44 is a side view illustrating the movement of the posture changing device.
Figure 45:
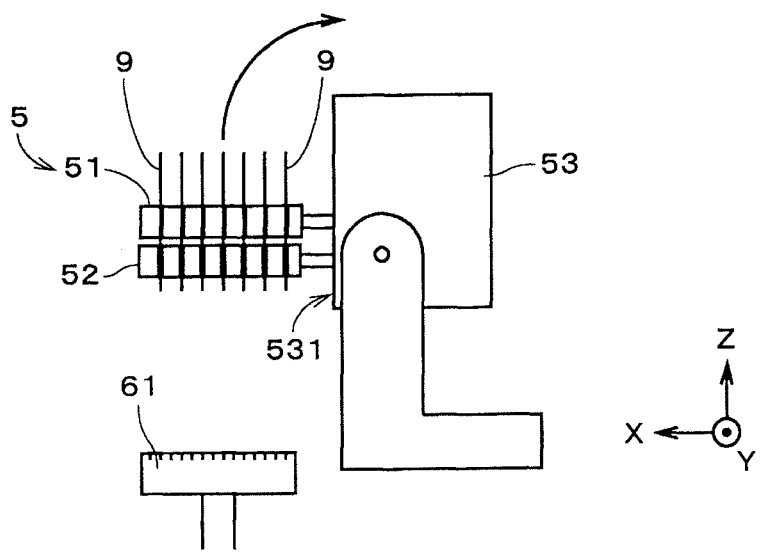
FIG. 45 is a side view illustrating the movement of the posture changing device.
Figure 46:
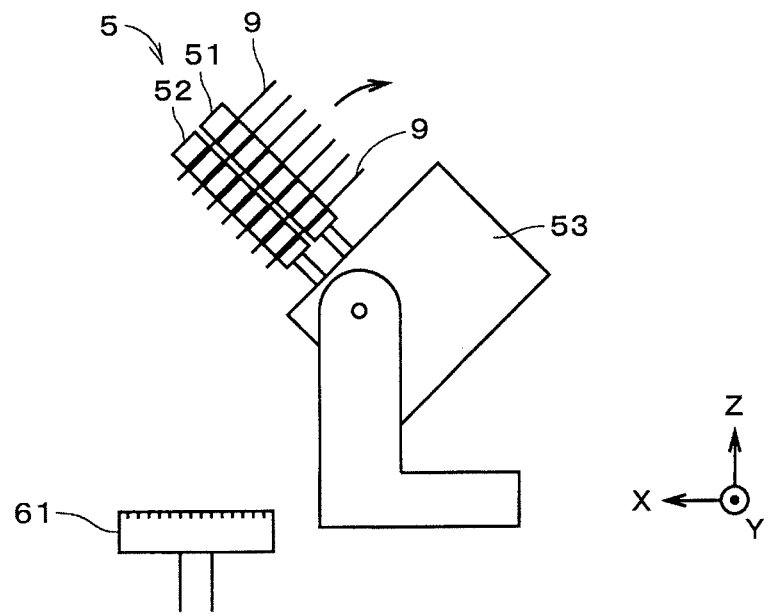
FIG. 46 is a side view illustrating the movement of the posture changing device.
Figure 47:
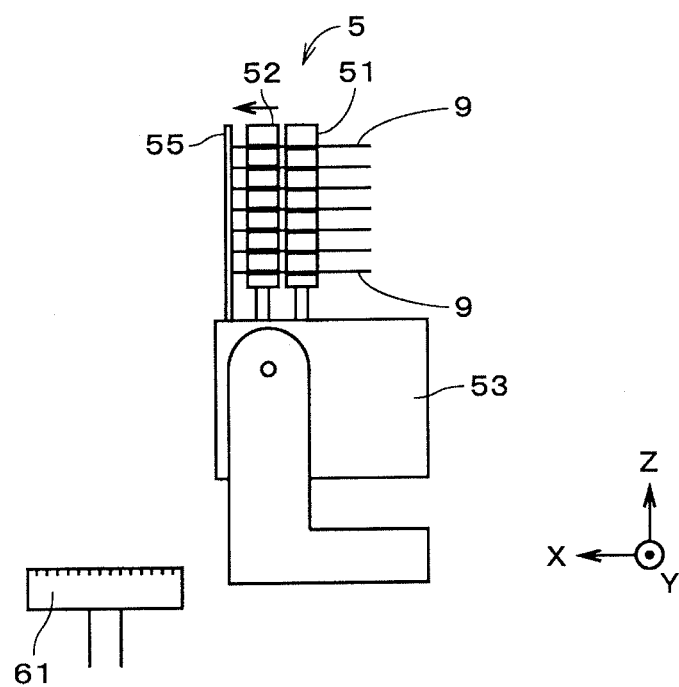
FIG. 47 is a side view illustrating the movement of the posture changing device.
Figure 48:
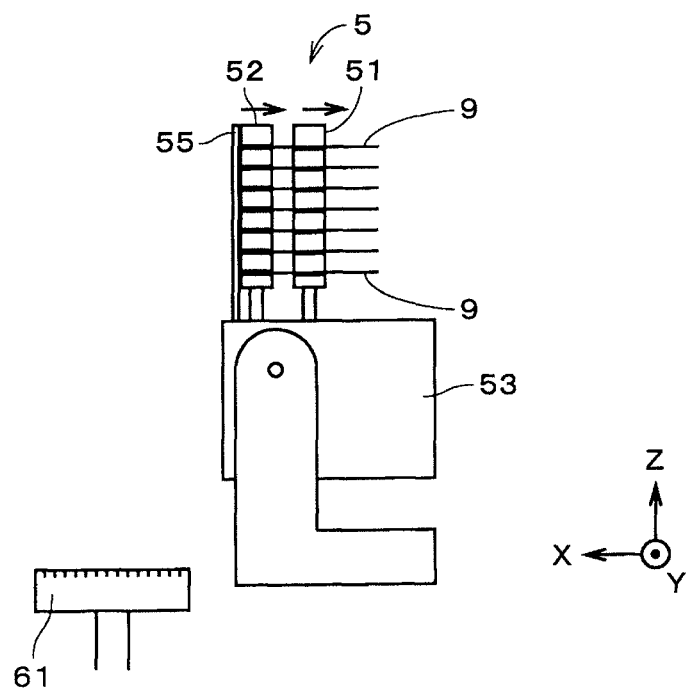
FIG. 48 is a side view illustrating the movement of the posture changing device.
Figure 49:
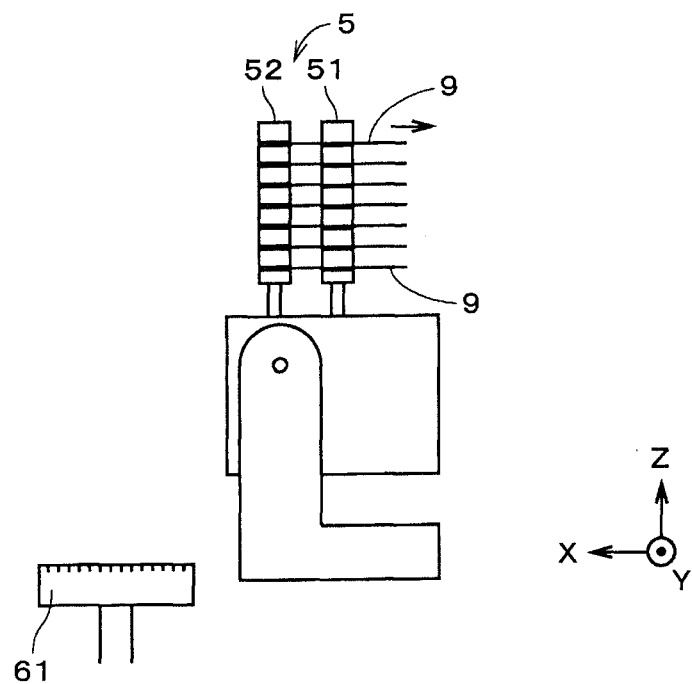
FIG. 49 is a side view illustrating the movement of the posture changing device.
Figure 50:
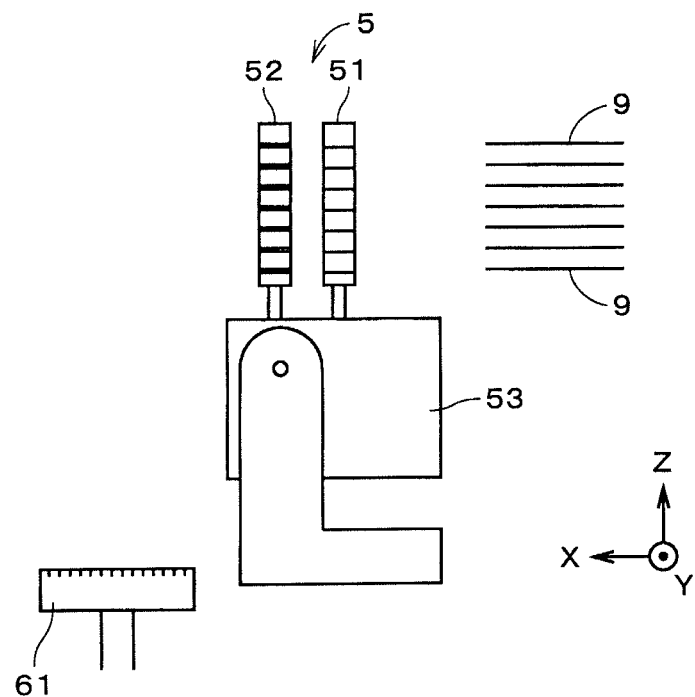
FIG. 50 is a side view illustrating the movement of the posture changing device.

Then, the up-and-down holder 61 that holds the first substrate group is horizontally rotated by 180 degrees (i.e., turned around) about the rotational shaft 63 and moved upward as illustrated in FIG. 38 (steps S28 and S29). Then, steps S21 to S27 are repeated for the substrates 9 in the first substrate group as illustrated in FIGS. 39 to 50. As a result, the first substrate group is transferred from the up-and-down holder 61 of the pusher 6 to the posture changing mechanism 5 and transported out of the posture changing mechanism 5.

As described above, the aforementioned posture changing device includes the vertical holder 52, the horizontal holder 51, the mounting block 53, the holder rotation mechanism 54, the holder shifting mechanism 56, the pusher 6, and the controller 100. When the substrates 9 are in a vertical posture, the vertical holder 52 catches and holds the lower edge portions of the substrates 9 on two sides in the circumferential direction of the bottom edge portion of the substrates 9, with the bottom edge portion projecting downward from the vertical holder 52. In the state in which the vertical holder 52 holds the substrates 9 in a vertical posture, the horizontal holder 51 is disposed above and adjacent to the vertical holder 52. When the substrates 9 are in a horizontal posture, the horizontal holder 51 supports the lower surfaces of the substrates 9 from the underside on opposite sides in a radial direction of the substrates 9. The vertical holder 52 and the horizontal holder 51 are mounted on the mounting block 53.

The holder rotation mechanism 54 rotates the mounting block 53 about the rotational shaft 541 pointing in the horizontal direction to switch between the vertical holding state and the horizontal holding state, the vertical holding state being a state in which the vertical holder 52 is capable of holding the substrates 9 in a vertical posture, and the horizontal holding state being a state in which the horizontal holder 51 is capable of holding the substrates 9 in a horizontal posture. The holder shifting mechanism 56 shifts the horizontal holder 51 relative to the vertical holder 52 in the thickness direction of the substrates 9. The pusher 6 transfers the substrates 9 held in a vertical posture to and from the vertical holder 52.

As described above, before transfer of the substrates 9 between the vertical holder 52 and the pusher 6, the controller 100 controls the holder shifting mechanism 56 on the basis of the warped state so as to shift the position in the thickness direction of the horizontal holder 51 by the shift distance from the vertical holder 52, the shift distance being determined on the basis of the warped state of the substrates 9. Thus, it is possible to suitably transfer the substrates 9 between the vertical holder 52 and the pusher 6, even if the substrates 9 are warped, while preventing the substrates 9 from coming into contact with the horizontal holder 51.

As described above, the holder shifting mechanism 56 relatively shifts the horizontal holder 51 in step S13 before the pusher 6 receives the substrates 9 from the vertical holder 52 in step S14. Thus, it is possible to suitably transfer the substrates 9 from the vertical holder 52 to the pusher 6 in step S14 while preventing the substrates 9 from coming into contact with the horizontal holder 51.

The holder shifting mechanism 56 relatively shifts the horizontal holder 51 (step S13) in the vertical holding state. In this way, the horizontal holder 51 is relatively shifted after the posture changing mechanism 5 is switched from the horizontal holding state to the vertical holding state in step S12. Thus, the substrates 9 continue to be supported by the horizontal holder 51 during switching from the horizontal holding state to the vertical holding state. As a result, it is possible to stably change the configuration of supporting the substrates 9 from the horizontal holder 51 to the vertical holder 52.

As described above, step S21 in which the holder shifting mechanism 56 relatively shifts the horizontal holder 51 is performed before step S23 in which the vertical holder 52 receives the substrates 9 from the pusher 6. Thus, it is possible to suitably transfer the substrates 9 from the pusher 6 to the vertical holder 52 in step S23 while preventing the substrates 9 from coming into contact with the horizontal holder 51.

As described above, the holder shifting mechanism 56 relatively shifts the horizontal holder 51 (step S21) in the horizontal holding state. Thus, the substrates 9 can be transferred from the pusher 6 to the vertical holder 52 immediately after the posture changing mechanism 5 is switched from the horizontal holding state to the vertical holding state in step S22, while preventing the substrates 9 from coming into contact with the horizontal holder 51. As a result, it is possible to reduce the amount of time required to process the substrates 9.

The posture changing device further includes the substrate alignment mechanism 8 as described above. The substrate alignment mechanism 8 rotates the substrates 9 in the circumferential direction to change the circumferential orientations of the substrates 9. When the substrates 9 are curved in one radial direction to one side in the thickness direction with a minimum curvature, the controller 100 controls the substrate alignment mechanism 8 on the basis of the warped state of the substrates 9 before transfer of the substrates 9 between the vertical holder 52 and the pusher 6 (step S14, S23). Thus, the above radial direction of the substrates 9 that is held in a vertical posture by the vertical holder 52 becomes parallel to the up-down direction. This minimizes the size in the thickness direction of the substrates 9 held in a vertical posture by the vertical holder 52. As a result, it is possible to reduce the aforementioned shift distance by which the horizontal holder 51 is relatively shifted in step S13 or S21.

The aforementioned posture changing device may change the posture of a single substrate 9, or may change the posture of a plurality of substrates 9 at once. When the posture changing device changes the posture of a plurality of substrates 9, the vertical holder 52 holds other substrates 9 in a vertical posture along with and in the same manner as a single substrate 9 in a vertical posture, the other substrates 9 being aligned with the single substrate 9 in the thickness direction. The horizontal holder 51 holds other substrates 9 in a horizontal posture along with and in the same manner as a single substrate 9 in a horizontal posture, the other substrates 9 being aligned with the single substrate 9 in the thickness direction. The pusher 6 transfers the other substrates 9 held in a vertical posture to and from the vertical holder 52, along with the single substrate 9 in a vertical posture. It is thus possible to suitably transfer a plurality of substrates 9 between the vertical holder 52 and the pusher 6 while preventing the substrates 9 from coming into contact with the horizontal holder 51.

The posture changing device and the substrate processing apparatus 10 described above may be modified in various ways.

For example, step S16 in which the shift of the horizontal holder 51 is restored may be performed between step S17 in which the posture changing mechanism 5 switches from the vertical holding state to the horizontal holding state and step S18 in which the up-and-down holder 61 is turned. Alternatively, step S16 may be performed between step S18 and step S11 that is performed subsequently. As another alternative, step S16 may be performed in parallel with step S17 or S18.

Step S21 of shifting the horizontal holder 51 may be performed between step S22 of switching the posture changing mechanism 5 from the horizontal holding state to the vertical holding state and step S23 of receiving the substrates 9 from the up-and-down holder 61 at the vertical holder 52. Alternatively, step S21 may be performed in parallel with step S22.

The substrate alignment mechanism 8 may be an apparatus having any of various types of structures as long as it is possible to rotate the substrates 9 in the circumferential direction to change the circumferential orientation of the substrates 9. For example, the substrate alignment mechanism 8 may be a mechanism for sequentially rotating the substrates 9 in a vertical posture in the circumferential direction to change the circumferential orientation of the substrates 9. The substrate alignment mechanism 8 may also be a mechanism for simultaneously rotating a plurality of substrates 9 in the circumferential direction to change the circumferential orientation of each substrate 9. As another alternative, the substrate alignment mechanism 8 may cause the notches 93 of the substrates 9 to engage with a predetermined engagement shaft in order to stop the rotation of the substrates 9. Note that the posture changing device does not necessarily have to include the substrate alignment mechanism 8.

The aforementioned posture changing device (i.e., the posture changing mechanism 5, the pusher 6, and the controller 100) may be used as a device independent of the other configuration of the substrate processing apparatus 10. Alternatively, the posture changing device may be incorporated into and used by any of various devices other than the aforementioned substrate processing apparatus 10.

The substrate processing apparatus 10 may be used to process glass substrates used in display devices such as liquid crystal displays, plasma displays, and field emission displays (FEDs), instead of semiconductor substrates. The substrate processing apparatus 10 may also be used to process other substrates such as optical disk substrates, magnetic disk substrates, magneto-optical disk substrates, photomask substrates, ceramic substrates, and solar-cell substrates.

The configurations of the above-described preferred embodiments and variations may be appropriately combined as long as there are no mutual inconsistencies.

While the invention has been shown and described in detail, the foregoing description is in all aspects illustrative and not restrictive. It is therefore to be understood that numerous modifications and variations can be devised without departing from the scope of the invention. This application claims priority benefit under 35 U.S.C. Section 119 of Japanese Patent Application No. 2016-190863 filed in the Japan Patent Office on Sep. 29, 2016, the entire disclosure of which is incorporated herein by reference.

REFERENCE SIGNS LIST

5 Posture changing mechanism
6 Pusher
8 Substrate alignment mechanism
9 Substrate
51 Horizontal holder
52 Vertical holder
53 Mounting block
54 Holder rotation mechanism
56 Holder shifting mechanism
100 Controller
S11 to S18, S21 to S29 Step

The invention claimed is:

1. A posture changing device for changing a posture of a substrate from one of horizontal and vertical postures to the other posture, the device comprising:
   a vertical holder for, when a substrate is in a vertical posture, catching and holding a lower edge portion of said substrate on two sides in a circumferential direction of a bottom edge portion of said substrate, with said bottom edge portion projecting downward from said vertical holder;
   a horizontal holder for, when said substrate is in a horizontal posture, supporting a lower surface of said substrate from underside on two sides in a radial direction of said substrate, said horizontal holder being disposed above and adjacent to said vertical holder in a state in which said vertical holder holds said substrate in a vertical posture;
   a mounting block on which said vertical holder and said horizontal holder are mounted;
   a holder rotator that rotates said mounting block about a rotational shaft pointing in a horizontal direction to switch between a vertical holding state and a horizontal holding state, said vertical holding state being a state in which said vertical holder is capable of holding said substrate in a vertical posture, and said horizontal holding state being a state in which said horizontal holder is capable of holding said substrate in a horizontal posture;
   a holder shifter that shifts said horizontal holder relative to said vertical holder in a thickness direction of said substrate;
   a pusher for transferring said substrate held in a vertical posture to and from said vertical holder;
   a controller for, before transfer of said substrate between said vertical holder and said pusher, controlling said holder shifter on the basis of a warped state of said substrate to shift a position in said thickness direction of said horizontal holder by a shift distance from said vertical holder, said shift distance being determined on the basis of said warped state; and
   a substrate alignment mechanism for rotating said substrate in a circumferential direction to change a circumferential orientation of said substrate,
   wherein, when said substrate is curved in one radial direction to one side in said thickness direction with a minimum curvature, said controller controls said substrate alignment mechanism on the basis of the warped state of said substrate, before transfer of said substrate between said vertical holder and said pusher, to make said one radial direction of said substrate that is held in a vertical posture by said vertical holder, parallel to an up-down direction.

2. The posture changing device according to claim 1, wherein
   said holder shifter relatively shifts said horizontal holder before said pusher receives said substrate from said vertical holder.

3. The posture changing device according to claim 2, wherein
   said holder shifter relatively shifts said horizontal holder in said vertical holding state.

4. The posture changing device according to claim 2, wherein
   said vertical holder holds another substrate in a vertical position along with and in the same manner as said substrate in a vertical posture, said another substrate being aligned with said substrate in said thickness direction,
   said horizontal holder holds said another substrate in a horizontal posture along with and in the same manner as said substrate in a horizontal posture, said another substrate being aligned with said substrate in said thickness direction, and
   said pusher transfers said another substrate held in a vertical posture to and from said vertical holder, along with said substrate held in a vertical posture.

5. The posture changing device according to claim 1, wherein
   said holder shifter relatively shifts said horizontal holder before said vertical holder receives said substrate from said pusher.

6. The posture changing device according to claim 5, wherein
   said holder shifter relatively shifts said horizontal holder in said horizontal holding state.

7. The posture changing device according to claim 5, wherein
   said vertical holder holds another substrate in a vertical position along with and in the same manner as said substrate in a vertical posture, said another substrate being aligned with said substrate in said thickness direction,
   said horizontal holder holds said another substrate in a horizontal posture along with and in the same manner as said substrate in a horizontal posture, said another substrate being aligned with said substrate in said thickness direction, and
   said pusher transfers said another substrate held in a vertical posture to and from said vertical holder, along with said substrate held in a vertical posture.

8. The posture changing device according to claim 1, wherein
   said vertical holder holds another substrate in a vertical position along with and in the same manner as said substrate in a vertical posture, said another substrate being aligned with said substrate in said thickness direction, said horizontal holder holds said another substrate in a horizontal posture along with and in the same manner as said substrate in a horizontal posture, said another substrate being aligned with said substrate in said thickness direction, and said pusher transfers said another substrate held in a vertical posture to and from said vertical holder, along with said substrate held in a vertical posture.

\* \* \* \* \*